(12) United States Patent
Chang et al.

(10) Patent No.: US 8,015,525 B2
(45) Date of Patent: *Sep. 6, 2011

(54) SYSTEM AND METHOD FOR ACCOMMODATING NON-GAUSSIAN AND NON-LINEAR SOURCES OF VARIATION IN STATISTICAL STATIC TIMING ANALYSIS

(75) Inventors: Hongliang Chang, St. Paul, MN (US); Sambasivan Narayan, Essex Junction, VT (US); Chandramouli Visweswariah, Croton-on-Hudson, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 479 days.

This patent is subject to a terminal disclaimer.

(21) Appl. No.: 12/114,203

(22) Filed: May 2, 2008

(65) Prior Publication Data

US 2008/0201676 A1  Aug. 21, 2008

Related U.S. Application Data

(63) Continuation of application No. 11/762,405, filed on Jun. 13, 2007, now abandoned, which is a continuation of application No. 11/056,850, filed on Feb. 11, 2005, now Pat. No. 7,293,248.

(51) Int. Cl.
   - *G06F 9/455* (2006.01)
   - *G06F 17/50* (2006.01)

(52) U.S. Cl. ........ 716/108; 716/106; 716/107; 716/113; 716/115; 716/134; 703/13; 703/14

(58) Field of Classification Search .................. 716/4–6, 716/18, 111, 113, 114, 115, 106–108, 134; 703/13–14
See application file for complete search history.

(56) References Cited

U.S. PATENT DOCUMENTS 5,880,967 A * 3/1999 Jyu et al. ........................ 716/6

OTHER PUBLICATIONS

Liou et al., Performance Sensitivity Using Statistical Methods and Its Applications to Delay Testing, 2000, IEEE, pp. 587-592.*
Rappaport et al. An Optimal Nonlinear Detector for Digital Data Transmission Through Non-Gaussian Channels, Jun. 1966, IEEE, pp. 266-274.*
Agarwal et al., Statistical Timing Analysis Using Bound and Selective Enumeration, Sep. 2003, IEEE, 1243-1260.*
Agarwal et.al., Path-based Statistical Timing Analysis Considering Inter and Intra-Die Correlations, ACM, Dec. 23, 2002, pp. 1-6.*

(Continued)

*Primary Examiner* — Nghia M Doan
(74) *Attorney, Agent, or Firm* — Tutunjian & Bietto, P.C.; Brian P. Verminkski, Esq.

(57) ABSTRACT

There is provided a system and method for statistical timing analysis and optimization of an electrical circuit having two or more digital elements. The system includes at least one parameter input and a statistical static timing analyzer and electrical circuit optimizer. The at least one parameter input is for receiving parameters of the electrical circuit. At least one of the parameters has at least one of a non-Gaussian probability distribution and a non-linear delay effect. The statistical static timing analyzer and electrical circuit optimizer is for calculating at least one of a signal arrival time and a signal required time for the electrical circuit using the at least one parameter and for modifying a component size of the electrical circuit to alter gate timing characteristics of the electrical circuit based upon the at least one of the signal arrival time and the signal required time.

37 Claims, 13 Drawing Sheets

OTHER PUBLICATIONS

Oakda et al., A Statistical Gate-delay Model Considering Intra-Gate Variability, Nov. 11-13, 2003, ACM, p. 908-913.*
U.S. Appl. No. 10/665,092, filed Sep. 18, 2003, C. Visweswariah.
U.S. Appl. No. 10/666,470, filed Sep. 19, 2003, C. Visweswariah.
U.S. Appl. No. 10/666,353, filed Sep. 19, 2003, C. Visweswariah.
C. Visweswarish et al., "First-Order Incremental Block-Based Statistical Timing Analysis", DAC 2004, pp. 331-336, San Diego, CA.
H. Chang et al., "Statistical Timing Analysis Considering Spatial Correlations Using A Single Pert-Like Traversal", ICCAD 2003, pp. 621-625, San Jose, CA.
J.J. Liou et al., "Fast Statistical Timing Analysis by Probablicist Event Propagation", DAC 2001, pp. 661-666, Las Vegas, NV.
M. Orshansky et al., "A General Probabilistic Framework for Worst Case Timing Analysis", DAC 2002, pp. 556-561, New Orleans, LA.
A. Devgan et al., "Block-based Static Timing Analysis with Uncertainty", ICCAD 2003, San Jose, CA.
A. Agarwal et al., "Statistical Timing Analysis Using Bounds and Selective Enumeration", IEEE Transactions on CAD of Inegrated Circuits and Systems, vol. 22, No. 9, 2003.

* cited by examiner

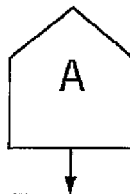
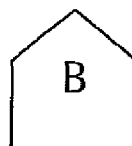

335 — Compute tightness probability $T_{A,k}$ that arrival time A is larger than B, i.e. $T_A = P(A>B)$ when non-Gaussian parameter variations are set to their average values $\Delta X_{k,N}$ in the k-th cell $$T_{A,k} = Q_k(\Delta X_{k,N}) = \Phi\left(\frac{a_0 + \sum_{i=1}^{n_N} a_{N,i}\Delta X_{N,i} - b_0 - \sum_{i=1}^{n_N} b_{N,i}\Delta X_{N,i}}{\theta_G}\right)$$

where:

$$\Phi(y) = \int_{-\infty}^{y} \phi(x)dx, \quad \phi(x) = \frac{1}{\sqrt{2\pi}} \exp\left(-\frac{x^2}{2}\right)$$

340 — Compute volume $\Delta V_k$ of k-th cell as the product of its dimensions

345 — Increment tightness probability $T_A$ by the contribution of the k-th cell
$T_A = T_A + p(\Delta X_{k,N}) T_{A,k} \Delta V_k$

350 — $k = k+1$

355 — $k <$ number of cells — YES / NO

360 — End

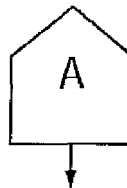
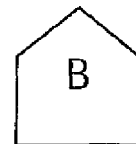

535 — Compute tightness probability $T_{A,k}$ that arrival time A is larger than B, i.e., $T_A = P(A>B)$ when non-linear and/or non-Gaussian parameter variations are set equal to their average values $\Delta X_{k,NL}$ in the k-th cell $$T_{A,k} = Q_k(\Delta X_{k,NL}) =$$

$$\Phi\left(\frac{a_0 + f_A(\Delta X_{NL}) - b_0 - f_B(\Delta X_{NL})}{\theta_L}\right)$$

where:

$$\Phi(y) = \int_{-\infty}^{y} \phi(x)dx, \quad \phi(x) = \frac{1}{\sqrt{2\pi}} \exp\left(-\frac{x^2}{2}\right)$$

540 — Compute volume $\Delta V_k$ of k-th cell as the product of its dimensions

545 — Increment tightness probability $T_A$ by the contribution of the k-th cell
$T_A = T_A + p(\Delta X_{k,NL}) T_{A,k} \Delta V_k$ 550 — $k = k+1$ 555 — k < number of cells — YES → B

NO

560 — End

FIG. 5 (Continued)

SYSTEM AND METHOD FOR ACCOMMODATING NON-GAUSSIAN AND NON-LINEAR SOURCES OF VARIATION IN STATISTICAL STATIC TIMING ANALYSIS

CROSS-REFERENCE TO RELATED APPLICATIONS

This application is a continuation of U.S. patent Ser. No. 11/762,405, filed Jun. 13, 2007 now abandoned, which is incorporated by reference herein in its entirety, and which, in turn, is a continuation of U.S. application Ser. No. 11/056,850, filed Feb. 11, 2005 now U.S. Pat. No. 7,293,248, issued on Nov. 6, 2007, which is also incorporated by reference herein in its entirety.

FIELD OF THE INVENTION

The present invention generally relates to statistical static timing analysis and, more particularly, to a system and method for accommodating non-Gaussian and nonlinear sources of variation in statistical static timing analysis.

BACKGROUND OF THE INVENTION

It is commonly recognized that electrical characteristics of transistors and interconnects are not the same for different chips and even for the same chip at different time moments or chip locations. Variation of electrical characteristics can be due to variation of process parameters, changing of environmental conditions and even chips aging (Hot Carriers Injections, Negative Bias Temperature Instability, electromigration, and so forth). Variation of electrical characteristics results in variations of gate timing characteristics. The traditional conservative way to handle these variations is to consider so-called process corners at which the gates have the worst combinations of delays. Then chips are designed so that they can properly function at all process corners assuming that as a result they will function at any other combination of gate delays.

Unfortunately, with decreasing transistor size and interconnect width, the variation of electrical characteristics is getting proportionally larger. Therefore, the approach to design for process corners, which used to work well, now results in too conservative and non-optimal designs because most design efforts and chip resources are spent to make chips function at very low-probability combinations of electrical characteristics.

An alternative approach to designing chips as described above is to consider actual statistical characteristics of process parameter variations and use them to compute statistical characteristics of a designed circuit. For digital circuits, this approach is known as statistical timing analysis. There are several varieties of statistical timing analysis.

One of the most useful for circuit analysis and optimization is parameterized statistical static timing analysis (STA). According to this technique, gate delays and signal arrival times are represented as functions of process parameters.

$$A = f(X_1, X_2, \ldots) \quad (1)$$

All the parameters are assumed independent. This assumption significantly simplifies the analysis but does not limit its applicability because independence can be obtained by a principal component analysis technique. Using this representation, the parameterized STA computes a statistical approximation of the circuit timing characteristics (arrival and required arrival times, delay, timing slack) as functions of the same parameters.

The process parameters can be considered as either globally correlated or fully random. Both types of parameters exhibit variation due to the manufacturing process. The correlated parameters have the same values for all gates and wires of the analyzed circuit while the fully random parameters vary for each gate independently. Usually, it is convenient to combine all the fully random parameters into one term.

The parameterized statistical STA can be either path-based or block-based. Path-based statistical STA analyzes each signal propagation path separately and computes the probability distribution for circuit delay as the probabilistic maximum of all paths delays. Usually this requires enumeration of all signal propagation paths and integration in the space of parameters variations, which is an inefficient computational procedure.

A more efficient technique of parameterized STA is so-called block-based statistical STA. This technique is very similar to traditional deterministic STA. It computes signal arrival times (or signal required arrival times) as functions of process parameters for each circuit node in their topological order similarly to propagating arrival times by a deterministic STA. It is convenient for both implementation and application. That kind of statistical timing analyzer can be easily implemented on the base of existing deterministic timing analyzer. This type of timing analysis lends itself to incremental operation, whereby after a change of the circuit is made, timing can be queried efficiently.

For computational efficiency, parameterized statistical block-based STA assumes that all parameters variations have normal Gaussian distributions and that gate and wire delays depend on parameters linearly. Without loss of generality, Gaussian distributions with 0 mean and unit standard deviation are assumed. This assumption allows representation of gate delays in first-order canonical form, as described by C. Visweswariah in U.S. patent application Ser. No. 10/666,353, entitled "System and Method for Statistical Timing Analysis of Digital Circuits", filed on Sep. 19, 2003, incorporated herein by reference in its entirety (hereinafter referred to as the "System and Method for Statistical Timing Analysis of Digital Circuits patent"):

$$A = a_0 + \sum_{i=1}^{n} a_i \cdot \Delta X_i + a_{n+1} \Delta R_a \quad (2)$$

where: $a_o$ is a mean value; $\Delta X_i$ is a variation of parameter $X_i$, $\Delta X_i = X_i - x_o$ where $x_0$ is the mean value of $X_i$; $a_i$ is the sensitivity of the gate delay to parameter variation $\Delta X_i$; $\Delta R_a$ is a random variable responsible for uncorrelated variation of the gate delay; and $a_{n+1}$ is a sensitivity of the gate delay to uncorrelated variation $\Delta R_n$. The following United States patent applications, commonly assigned to the assignee herein, are incorporated by reference herein in their entireties: U.S. patent application Ser. No. 10/665,092, entitled "System and Method for Incremental Statistical Timing Analysis of Digital Circuits", filed on Sep. 18, 2003; U.S. patent application Ser. No. 10/666,353, entitled "System and Method for Statistical Timing Analysis of Digital Circuits", filed on Sep. 19, 2003; and U.S. patent application Ser. No. 10/666,470, entitled "System and Method for Probabilistic Criticality Prediction of Digital Circuits", filed on Sep. 19, 2003.

Sensitivity coefficients express dependency of a gate delay on a process parameter. The last coefficient expresses a fully random part of delay variation. Using unit Gaussian but not arbitrary Gaussian distributions simplifies the analysis but is not restrictive because parameter distributions can always be normalized, e.g., by accumulating their non-zero means into delay means and properly adjusting sensitivity coefficients.

Block-based STA computes arrival times at each circuit node using two basic operations: incrementing arrival time by a gate delay and computing worst-case arrival time. The incrementing of the arrival time by a gate delay corresponds to propagating signals from a gate input to its output. This operation is performed by summation of the arrival time at the gate input and gate delay. The computing of the worst-case arrival time selects the worst-case signal from the signals arriving at a gate's inputs. The worst signal can be the latest or the earliest one depending on the type of timing analysis. The computing of the worst-case arrival time is performed by computing the maximum or the minimum of several arrival times. Herein, only the case of computing the latest arrival time is discussed. However, it is to be appreciated that the proposed approach can be easily extended to computation of the earliest arrival time using obvious symmetry between minimum and maximum functions, while maintaining the spirit of the present invention.

In deterministic timing analysis, these basic operations are trivial. In the statistical case, the situation is more complex because expressions, and not simply numbers, are operated upon.

Using the first-order canonical form of gate delays and applying some approximation, it is possible to compute signal arrival times at circuit nodes and circuit delay in the same linear canonical form. Incrementing an arrival time by a gate delay given in the first-order canonical form Equation 2 is known. Incrementing the arrival time is performed by summing the corresponding sensitivity coefficients, as described in the System and Method for Statistical Timing Analysis of Digital Circuits patent and, thus, it is not considered herein.

The computation of the maximum of the two arrival times represented in the first-order form Equation 2 is significantly more difficult because the maximum is a non-linear function. Therefore, parameterized statistical STA computes an approximate first-order representation of the maximum of the two arrival times.

Linear and Gaussian assumptions are very convenient for statistical parameterized STA because it is possible to use approximate analytical formulae for computing canonical forms of arrival times. Analytical formulae make statistical timing analysis fast and computationally efficient, which is important for implementing a statistical approach in circuit synthesis and optimization. Unfortunately, process parameters may have probability distributions, which are significantly different from Gaussian. It is impossible to approximate certain asymmetric distributions by Gaussian ones with a reasonable error. For example, via resistance distributions are asymmetric. Another problem arises from the fact that some parameters can affect delay in a non-linear way. Usually a linear approximation is justified by assuming that process parameter variation and the corresponding delay variation is sufficiently small. However, with the reduction of transistor sizes, process variation is getting higher. Therefore, a linear approximation of delay dependence on variation is not always sufficiently accurate. For example, delay of a gate depends on transistor channel length non-linearly.

Accordingly, it would be desirable and highly advantageous to have a system and method for accommodating non-Gaussian and nonlinear sources of variation in statistical static timing analysis.

SUMMARY OF THE INVENTION

These and other drawbacks and disadvantages of the prior art are addressed by the present invention, which is directed to a system and method for accommodating non-Gaussian and non-linear sources of variation in statistical static timing analysis.

According to an aspect of the present invention, there is provided a system for statistical timing analysis and optimization of an electrical circuit having two or more digital elements. At least one parameter input is for receiving parameters of the electrical circuit. At least one of the parameters has at least one of a non-Gaussian probability distribution and a non-linear delay effect. A statistical static timing analyzer and electrical circuit optimizer is for calculating at least one of a signal arrival time and a signal required time for the electrical circuit using the at least one parameter, and for modifying a component size of the electrical circuit to alter gate timing characteristics of the electrical circuit based upon the at least one of the signal arrival time and the signal required time.

According to another aspect of the present invention, there is provided a method for statistical timing analysis and optimization of an electrical circuit. Parameters of the electrical circuit are received. At least one of the parameters has at least one of a non-Gaussian probability distribution and a non-linear delay effect. A statistical static timing analysis is performed to calculate at least one of a signal arrival time and a signal required time for the electrical circuit using the at least one parameter. A component size of the electrical circuit is modified to alter gate timing characteristics of the electrical circuit based upon the at least one of the signal arrival time and the signal required time.

These and other aspects, features and advantages of the present invention will become apparent from the following detailed description of exemplary embodiments, which is to be read in connection with the accompanying drawings.

BRIEF DESCRIPTION OF THE DRAWINGS

The present invention may be better understood in accordance with the following exemplary figures, in which.

DETAILED DESCRIPTION OF PREFERRED EMBODIMENTS

Figure 1:
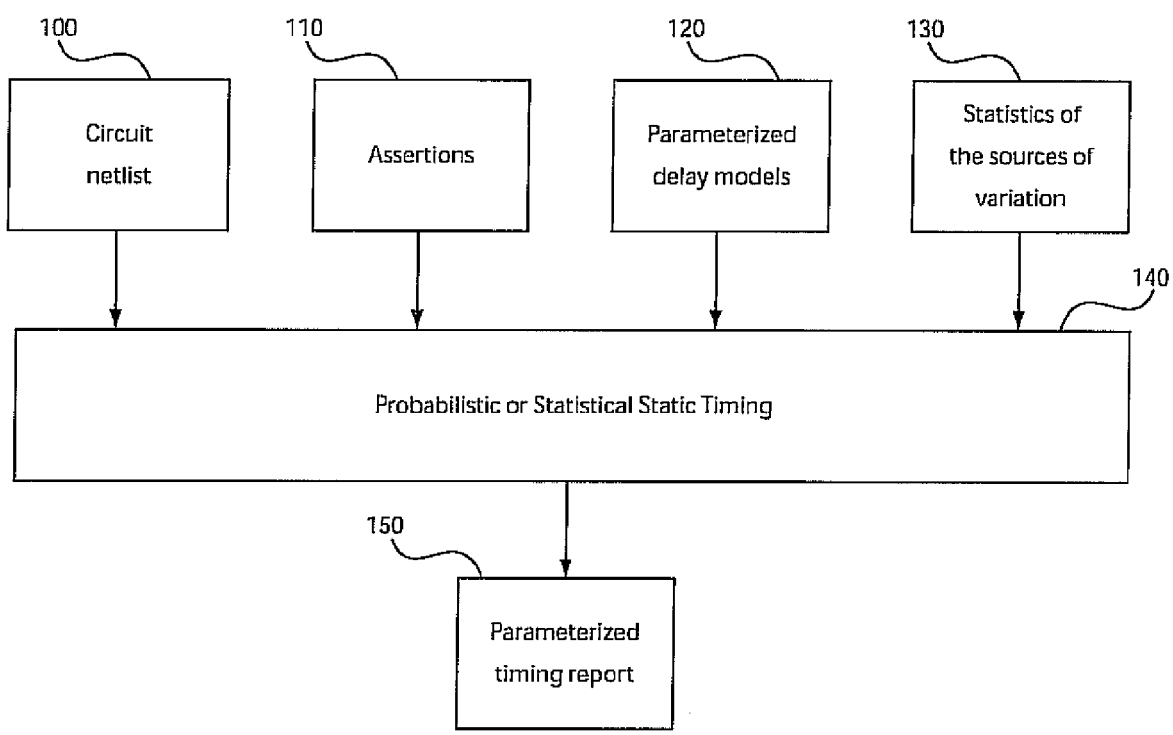
FIG. 1 is a block diagram illustrating a parameterized statistical static timing analysis tool, according to an illustrative embodiment of the present invention.

The present invention is directed to a system and method for accommodating non-Gaussian and nonlinear sources of variation in statistical static timing analysis.

Digital systems typically work on the basis of the circuit doing some work or computation in each clock cycle or "tick." In a certain clock cycle, a given signal may not switch, may switch once, or may switch many times, depending on the inputs applied to the circuit. Within each clock cycle, for each and every signal in the system, we are very interested in knowing two things to ensure correct timing: namely the early mode arrival time (or "early arrival time" for short) and the late mode arrival time (or "late arrival time" for short).

The early mode arrival time is the earliest time at which the signal could possibly switch (i.e., change from the stable logical state at which it was during the previous clock cycle). It is preferred to have the previous cycle "settled down" and recorded correct logic values before the logic values changed or switched during the current clock cycle.

The earliest time at which the signal is ALLOWED to switch and still let the circuit work properly is referred to as the "early required time".

The late mode arrival time is the latest time at which the signal will stop switching and become stable. It would be beneficial to make sure that the circuit has completed its function in time to meet the clock cycle constraint. The time at which the signal has to stop switching and become stable at its final stable logical state to allow correct functioning of the circuit is called the late required time.

Timers compute arrival times by "forward propagation" of timing values through a timing graph, and required times by "backward propagation" of timing values through a timing graph.

The present description illustrates the principles of the present invention. It will thus be appreciated that those skilled in the art will be able to devise various arrangements that, although not explicitly described or shown herein, embody the principles of the invention and are included within its spirit and scope.

All examples and conditional language recited herein are intended for pedagogical purposes to aid the reader in understanding the principles of the invention and the concepts contributed by the inventor to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means that can provide those functionalities as equivalent to those shown herein.

FIG. 1 is a block diagram illustrating a parameterized statistical static timing analysis tool 102, according to an illustrative embodiment of the present invention. The first input to the analysis tool 102 is the circuit netlist 100 representing the structure of the circuit to be analyzed. The second input is a set of timing assertions 110. These typically include arrival times at the primary inputs, required arrival times at the primary outputs, information about the phases of the clock, and details of external loads that are driven by the primary outputs. The assertions can be in the form of deterministic numbers or independent probability distributions or correlated probability distributions. The third input is a set of parameterized delay models 120. These allow the timer to determine the delay of a gate or wire as a function not only of traditional delay-model variables (like input slew or rise/fall time, and output load) but also as a function of the sources of variation. For example, a first-order linear model may be employed, like the one shown below:

$$\text{delay} = a_0 + \sum_{i=1}^{n} a_i \Delta x_i + a_{n+1} \Delta R,$$

where the delay consists of a deterministic (constant) portion $a_0$, a correlated (or global) portion $$\sum_{i=1}^{n} a_i \Delta x_i$$

and an independent (or local) portion $a_{n+1}\Delta R$. The number of sources of variation is n, and $a_i$, i=1, ..., n are the sensitivities of the delay to the sources of variation $x_i$, i=1, ..., n and $a_{n+1}$ is the sensitivity to an independent random source of variations. The notation $\Delta x_i$ denotes the deviation of $x_i$ from its mean or nominal value, and $\Delta R$ denotes the deviation of R from its mean or nominal value. It is to be understood that the delay models can be stored in a pre-characterization step or calculated on the fly as required. The format in which they are stored could include analytical delay equations or table models. The next input is information about the statistics of the sources of variation 130. This input typically has a list of the sources of variation with a mean value and standard deviation for each source of variation. Any correlations between the sources of variation are specified here.

The probabilistic or statistical static timing module 140 accepts all of these inputs and produces a novel parameterized statistical timing report 150. This report typically includes arrival times, required arrival times, slacks and slews at each node of the circuit. These timing quantities are not single numbers, but rather they are probability distributions. The information in the timing report can take many forms, including one or more of: mean value and variance for each timing quantity, a parameterized representation of the distribution of each timing quantity, a graphical representation of the distribution of each timing quantity, and a correlation report between these various timing quantities. Various automatic audits such as checking for excessive sensitivities can be built into the timing report. The excessive sensitivities are of interest since they are preferred to be reduced in order to improve the robustness of the circuit. It is to be understood that the circuit being timed can be very large and can consist of millions of gates and wires. All the information mentioned above could be extremely voluminous, and so it is ordinary practice to provide options to selectively output the required information, or even calculate or graphically display all this information on-demand.

A novel method and apparatus are provided for handling process parameters with non-Gaussian probability distributions and/or affecting gate delay non-linearly. The most obvious way to handle such complications as arbitrary non-Gaussian distributions and non-linear dependences is to apply a purely numerical approach. However, this automatically results in a loss of computational efficiency. On the other hand, the necessity to handle arbitrary distributions and arbitrary non-linear effects is preferable to obtain accurate results. Herein, a combined technique is described which processes linear parameters having Gaussian distributions analytically similar to the prior art parameterized statistical timing analysis. Non-linear and non-Gaussian parameters are processed numerically which allows for avoidance of any restrictions on probability distributions or types of non-linearity. Such an approach is efficient for cases when linear Gaussian approximation is accurate enough for most parameters and only a few parameters demonstrate complex non-linear and/or non-Gaussian behavior. Experiments have shown that it is the most common practical case.

The present invention extends the prior art parameterized statistical block-based STA proposed in the System and Method for Statistical Timing Analysis of Digital Circuits patent. The present invention uses a generalized version of the linear canonical form for representing gate delays. Moreover, the present invention computes an approximation of all arrival times in the same generalized canonical form, matching the exact mean and standard deviation in a manner completely similar to the original statistical STA. Therefore, the present invention is very convenient for implementation in a statistical timing analyzer. The present invention was implemented by adding several functions, which handle non-linear and non-Gaussian effects without any significant changes of the existing code.

A description will now be given regarding first-order approximation of the maximum of arrival times depending on Gaussian parameters.

Assume that arrival times A and B have the first-order representation:

$$A = a_0 + \sum_{i=1}^{n} a_i \cdot \Delta X_i + a_{n+1} \cdot \Delta R_a \tag{3}$$

$$B = b_0 + \sum_{i=1}^{n} b_i \cdot \Delta X_i + b_{n+1} \cdot \Delta R_b$$

All parameters variations have Gaussian probability distributions.

According to the System and Method for Statistical Timing Analysis of Digital Circuits patent, C=max(A,B) can be approximately expressed in the same first-order form:

$$C_{appr} = c_0 + \sum_{i=1}^{n} c_i \cdot \Delta X_i + c_{n+1} \cdot \Delta R_c \tag{4}$$

having the same mean and variance values as actual C=max(A,B).

Figure 2:
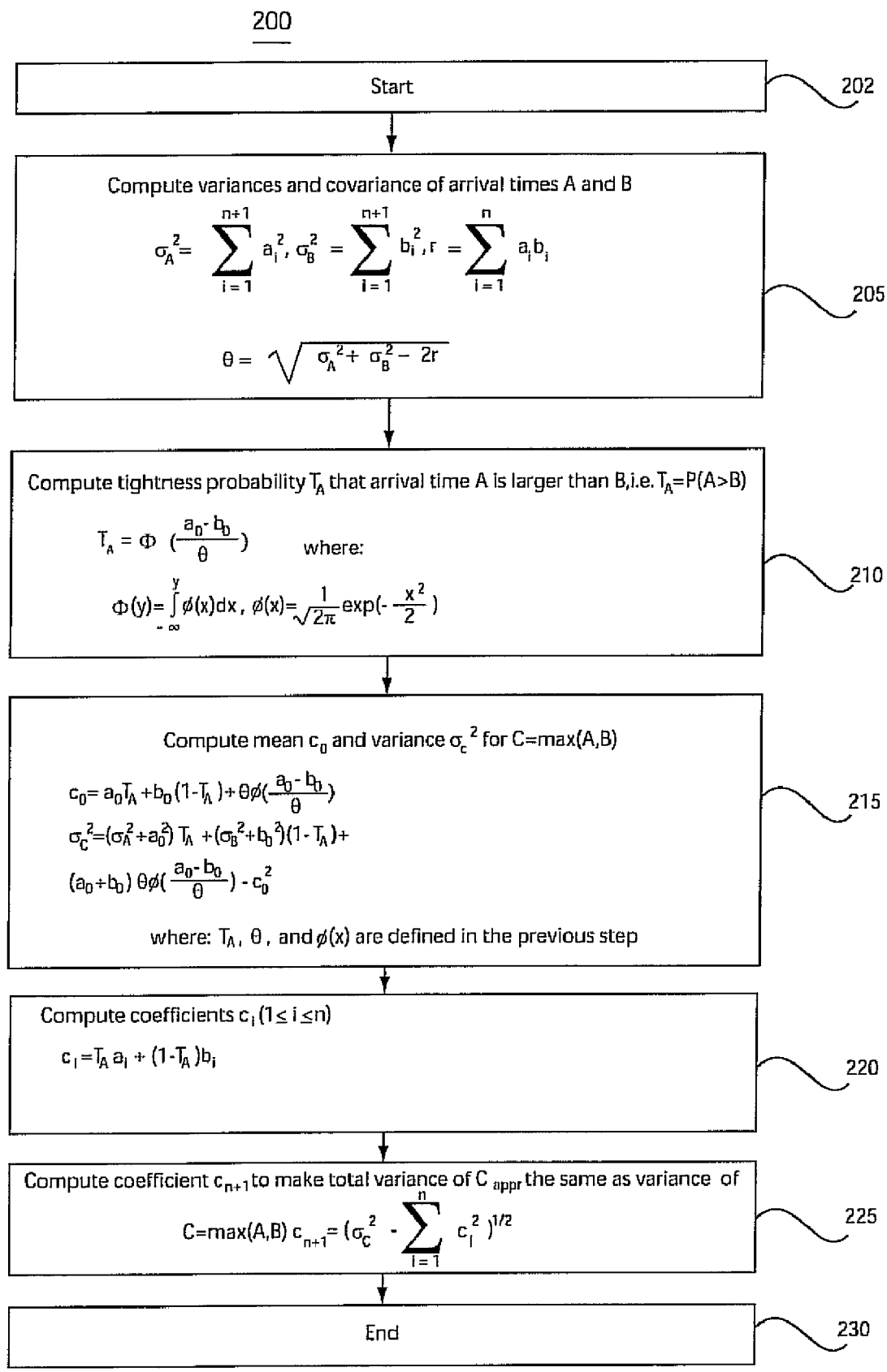
FIG. 2 is a flow diagram illustrating a method for computing parameters of the first-order canonical form $C_{appr}$ approximating the maximum of two arrival times in first-order canonical form with linear Gaussian parameters, according to an illustrative embodiment of the present invention.

The values of $c_0$, $c_i$ and $c_{n+1}$ are computed by the following method of FIG. 2. FIG. 2 is a flow diagram illustrating a method 200 for computing parameters of the first-order canonical form $C_{appr}$ approximating the maximum of two arrival times in first-order canonical form with linear Gaussian parameters, according to an illustrative embodiment of the present invention.

A start block 202 passes control to a function block 205. The function block 205 computes variances and covariance of arrival times A and B as follows:

$$\sigma_A^2 = \sum_{i=1}^{n+1} a_i^2, \sigma_B^2 = \sum_{i=1}^{n+1} b_i^2, r = \sum_{i=1}^{n} a_i b_i \tag{5}$$

$$\theta = \sqrt{\sigma_A^2 + \sigma_B^2 - 2r};$$

and passes control to a function block 210. The function block 210 computes the tightness probability $T_A$ that arrival time A is larger than B, i.e., $T_A = P(A>B)$ as follows:

$$T_A = \int_{B-A<0} p(\Delta X, \Delta R_a, \Delta R_b) \cdot d\Delta X \cdot d\Delta R_a \cdot d\Delta R_b \tag{6}$$

where: $p(\Delta X, \Delta R_a, \Delta R_b)$ is joint probability density function. For parameters, having Gaussian distribution tightness probability $T_A$ can be computed by the following closed form analytical expressions:

$$T_A = \Phi\left(\frac{a_0 - b_0}{\theta}\right) \text{ where:} \tag{7}$$

$$\Phi(y) = \int_{-\infty}^{y} \phi(x) \, dx, \, \phi(x) = \frac{1}{\sqrt{2\pi}} \exp\left(-\frac{x^2}{2}\right);$$

and passes control to a function block 215. The function block 215 computes the mean $c_0$ and variance $\sigma_c^2$ for C=max(A,B) as follows:

$$c_0 = a_0 T_A + b_0(1 - T_A) + \theta\phi\left(\frac{a_0 - b_0}{\theta}\right) \tag{8}$$

$$\sigma_c^2 = (\sigma_A^2 + a_0^2)T_A + (\sigma_B^2 + b_0^2)(1 - T_A) + (a_0 + b_0)\theta\phi\left(\frac{a_0 - b_0}{\theta}\right) - c_0^2;$$

where $T_A$, $\theta$, and $\phi(x)$ are defined in the previous step; and passes control to a function block 220. The function block 220 computes the coefficients $c_i$ ($1 \leq i \leq n$) as follows:

$$c_i = T_A a_i + (1 - T_A) b_i, \tag{9}$$

and passes control to a function block 225. The function block 225 computes the coefficient $c_{n+1}$ to make the total variance of $C_{appr}$ the same as the variance of C=max(A,B), and passes control to an end block 230.

A description will now be given regarding the inventive first-order approximation of the maximum of arrival times depending both on Gaussian and non-Gaussian parameters.

Assume that arrival times A and B have the first-order representation with parameter variations having both Gaussian and non-Gaussian probability distributions. Gaussian and non-Gaussian parameters in the first-order representations are separated and the following formulae are obtained:

$$A = a_0 + \sum_{i=1}^{n_G} a_{G,i} \cdot \Delta X_{G,i} + \sum_{i=1}^{n_N} a_{N,i} \cdot \Delta X_{N,i} + a_{n+1} \cdot \Delta R_a \tag{10}$$

$$B = b_0 + \sum_{i=1}^{n_G} b_{G,i} \cdot \Delta X_{G,i} + \sum_{i=1}^{n_N} b_{N,i} \cdot \Delta X_{N,i} + b_{n+1} \cdot \Delta R_b$$

where $\Delta_{G,i}$ are parameters with Gaussian probability distribution; $\Delta X_{N,i}$ are parameters with non-Gaussian probability distribution; and $\Delta R_a$ and $\Delta R_b$ are parameters responsible for uncorrelated variation of the arrival times. Uncorrelated variations are assumed to be Gaussian.

The incrementing of the arrival time given in the form of Equation 10 by a gate delay given in the same form is obvious. Similar to the pure Gaussian case as described in the System and Method for Statistical Timing Analysis of Digital Circuits patent, the correspondent coefficients of their first-order forms are summed. A much more difficult problem is to derive an approximate first-order representation for C=max(A,B):

$$C_{appr} = c_0 + \sum_{i=1}^{n_G} c_{G,i} \cdot \Delta X_{G,i} + \sum_{i=1}^{n_N} c_{N,i} \cdot \Delta X_{N,i} + c_{n+1} \cdot \Delta R_c \tag{11}$$

having the same mean and variance values as the exact distribution of C=max(A,B). This problem is solved by computing proper values of $c_0$, $c_{G,i}$, $c_{N,i}$ and $c_{n+1}$.

The same idea is used as in the case with pure Gaussian distributions as described in the System and Method for Statistical Timing Analysis of Digital Circuits patent. First, the tightness probability $T_A$ is computed, which is the probability that arrival time A is more than arrival time B. Then, coefficients $c_{G,i}$ and $c_{N,i}$ are expressed as linear combinations of coefficients $a_{G,i}$ and, $b_{G,i}$ and $a_{N,i}$ and $b_{N,i}$ correspondingly:

$$c_{G,i} = T_A \cdot a_{G,i} + (1 - T_A) \cdot b_{G,i}$$

$$c_{N,i} = T_A \cdot a_{dN,i} + (1 - T_A) \cdot b_{N,i} \tag{12}$$

Coefficients $c_0$ and $c_{n+1}$ are computed so that the mean and variance values for $C_{appr}$ are the same as for actual C=max (A,B).

Implementation of this approach requires computing: tightness probabilities $T_A$; and mean and variance of C=max (A,B).

These values are computed by separating integration over the subspaces of parameters with Gaussian and non-Gaussian distributions. The integration over the subspace of Gaussian parameters can be done analytically. The integration over the subspace of non-Gaussian parameters is done numerically.

A description will now be given regarding tightness probability computation.

For arrival times A and B, having first-order representations as per Equation 10, the tightness probability $T_A$=P (A>B)=P(B−A<0) is defined as follows:

$$T_A = \int_{B-A<0} p(\Delta X_N, \Delta X_G, \Delta R_a, \Delta R_b) \cdot d\Delta X_N \cdot d\Delta X_G \cdot d\Delta R_a \cdot d\Delta R_b \tag{13}$$

where $p(\Delta X_N, \Delta X_G, \Delta R_a, \Delta R_b)$ is a joint probability density function of all the parameter variations. Using the independence of the parameters, this joint probability density function can be decomposed into a product of Gaussian and non-Gaussian density functions as follows:

$$p(\Delta X_N, \Delta X_G, \Delta R_a, \Delta R_b) = p(\Delta X_N) \cdot p(\Delta X_G, \Delta R_a, \Delta R_b) \tag{14}$$

By substituting expressions in Equation 10 for A and B in the inequality B−A<0, the following inequality is obtained:

$$b_0 - a_0 + \sum_{i=1}^{n_N} (b_{N,i} - a_{N,i}) \Delta X_{N,i} + \tag{15}$$

$$\sum_{i=1}^{n_G} (b_{G,i} - a_{G,i}) \Delta X_{G,i} + b_{n+1} \Delta R_b - a_{n+1} \Delta R_a < 0$$

After rearranging terms, the following is obtained:

$$\sum_{i=1}^{n_G} (b_{G,i} - a_{G,i}) \Delta X_{G,i} + b_{n+1} \Delta R_b - a_{n+1} \Delta R_a < \tag{16}$$

$$a_0 - b_0 + \sum_{i=1}^{n_N} (a_{N,i} - b_{N,i}) \Delta X_{N,i}$$

Now this form of the inequality B−A<0 will be used to specify the integration region in Equation 13. Using the representation of probability density function as a product of Gaussian and non-Gaussian parts per Equation 14, the tightness probability of Equation 13 is represented as follows:

$$T_A = \int_{-\infty}^{\infty} p(\Delta X_N) Q(\Delta X_N) d\Delta X_N \qquad (17)$$

where $Q(\Delta X_N)$ is the following integral:

$$Q(\Delta X_N) = \int_{\substack{\sum_{i=1}^{n_G}(b_{G,i}-a_{G,i})\Delta X_{G,i}- \\ a_{n+1}\Delta R_a + b_{n+1}\Delta R_b < \\ a_0-b_0+ \\ \sum_{i=1}^{n_N}(a_{N,i}-b_{N,i})\Delta X_{N,i}}} p(\Delta X_G, \Delta R_a, \Delta R_b) d\Delta X_G d\Delta R_a d\Delta R_b \qquad (18)$$

The integration in Equation 18 is performed in the subspace of parameters with Gaussian distributions only. The integration is performed over the region obtained by the cross section of the region B−A<0 of the whole space with the hyper-plane $\Delta X_N$=const, where const represents a vector of values that do not vary during the integration. In other words, $Q(\Delta X_N)$ is a conditional probability $P(B-A<0|\Delta X_N=\text{const})$, i.e., the probability that B−A<0 at the condition of fixed values $\Delta X_N$.

It can be seen that $Q(\Delta X_N)$ can be considered as the tightness probability of variables $A_G$ and $B_G$ defined by the following first-order forms:

$$A_G = a_{G,0} + \sum_{i=1}^{n_G} a_{G,i} \Delta X_{G,i} + a_{n+1} \Delta R_a \qquad (19)$$

$$B_G = b_{G,0} + \sum_{i=1}^{n_G} b_{G,i} \Delta X_{G,i} + b_{n+1} \Delta R_b$$

where $a_{G,0}$ and $b_{G,0}$ are mean values of $A_G$ and $B_G$:

$$a_{G,0} = a_0 + \sum_{i=1}^{n_N} a_{N,i} \Delta X_{N,i} \qquad (20)$$

$$b_{G,0} = b_0 + \sum_{i=1}^{n_N} b_{N,i} \Delta X_{N,i}$$

Here, $\Delta X_N$ is considered not as a vector of random variables but as a vector of parameters having constant values during tightness probability computation. In fact, $A_G$ and $B_G$ are exactly A and B, where $\Delta X_N$ are considered as fixed parameters and not random variable.

Obviously $A_G$ and $B_G$ depend only on parameter variations having Gaussian distributions. Therefore, using the approach of procedure 200 of FIG. 2 for computing the tightness probability for the Gaussian case, $Q(\Delta X_N)$ can be computed analytically in closed form per Equation 7.

Substituting the analytical expression of $Q(\Delta X_N)$ into Equation 17, the tightness probability $T_A$ is computed by numerical integration over the subspace of non-Gaussian parameter variations $\Delta X_N$. The numerical integration can be performed using any known method for multidimensional numerical integration. For example, for the simplest numerical integration approach, the tightness probability can be computed by the following method described herein below with respect to FIG. 3.

Figure 3:
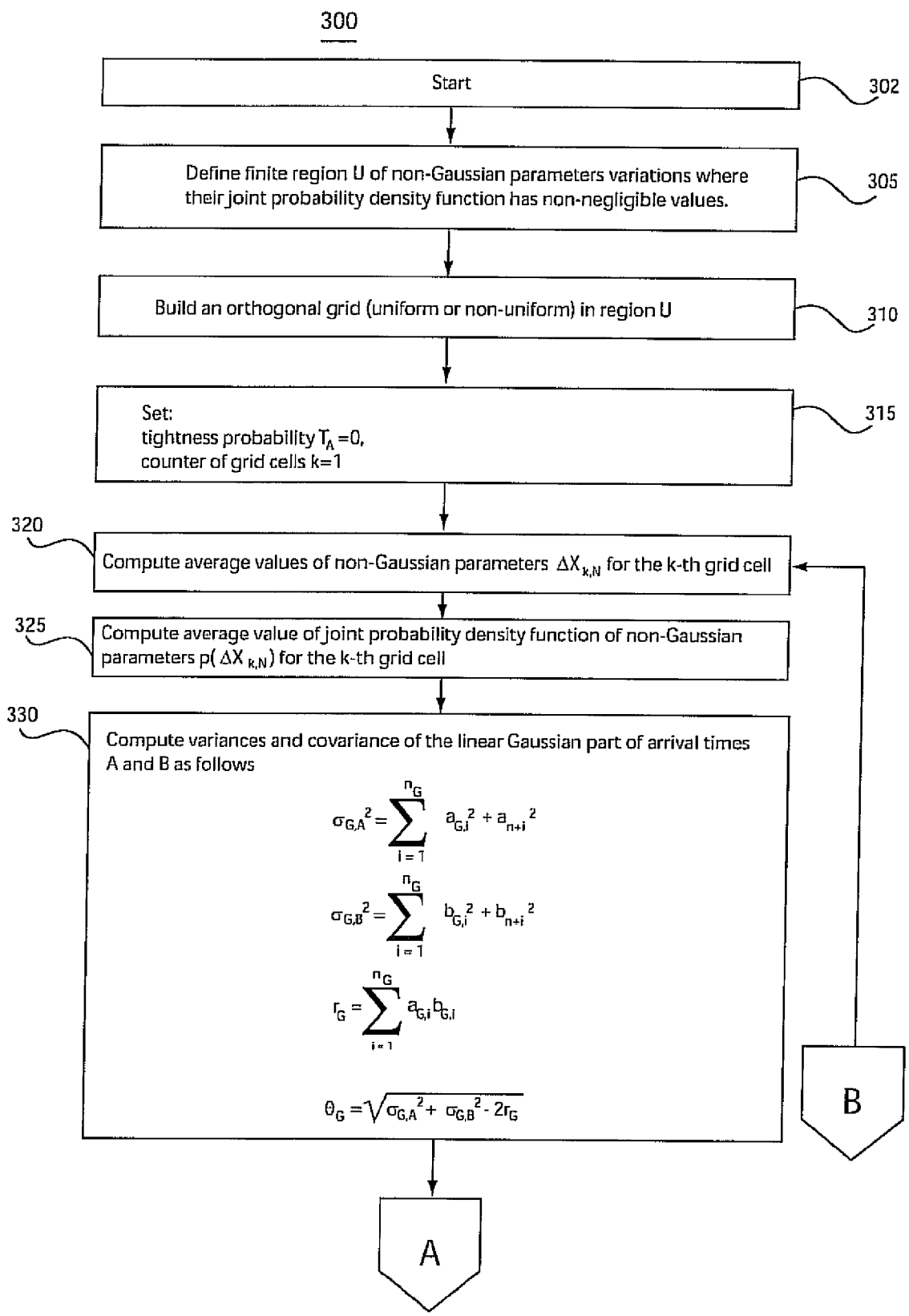
FIG. 3 is a flow diagram illustrating a method for computing a tightness probability with non-Gaussian parameters, according to an illustrative embodiment of the present invention.

FIG. 3 is a flow diagram illustrating a method 300 for computing a tightness probability with non-Gaussian parameters, according to an illustrative embodiment of the present invention.

A start block 302 passes control to a function block 305 that defines a finite region U of non-Gaussian parameter variations where their joint probability density function has non-negligible values, and passes control to a function block 310. The function block 310 builds an orthogonal grid (uniform or non-uniform) in region U, and passes control to a function block 315. The number of grid cells controls the accuracy of the procedure: the more the grid cells, the higher the accuracy and the higher the computational cost. The function block 315 sets the tightness probability $T_A$=0, sets a counter of grid cells k=1, and passes control to a function block 320. The function block 320 computes the average values of non-Gaussian parameters $\Delta X_{k,N}$ for the k-th grid cell, and passes control to a function block 325. The function block 325 computes the average value of the joint probability density function of non-Gaussian parameters $p(\Delta X_{k,N})$ for the k-th grid cell, and passes control to a function block 330. The function block 330 computes variances and covariance of the linear Gaussian part of arrival times A and B as follows:

$$\sigma_{G,A}^2 = \sum_{i=1}^{n_G} a_{G,i}^2 + a_{n+1}^2$$

$$\sigma_{G,B}^2 = \sum_{i=1}^{n_G} b_{G,i}^2 + b_{n+1}^2$$

$$r_G = \sum_{i=1}^{n_G} a_{G,i} b_{G,i}$$

$$\theta_G = \sqrt{\sigma_{G,A}^2 + \sigma_{G,B}^2 - 2r_G},$$

and passes control to a function block 335. The function block 335 computes the tightness probability $T_{A,k}$ that arrival time A is larger than B, i.e., $T_A=P(A>B)$ when non-Gaussian parameters are set to their average values $\Delta X_{k,N}$ in the k-th cell as follows:

$$T_{A,k} = Q_k(\Delta X_{k,N})$$

$$= \Phi\left(\frac{a_0 + \sum_{i=1}^{n_N} a_{N,i}\Delta X_{N,i} - b_0 - \sum_{i=1}^{n_N} b_{N,i}\Delta X_{N,i}}{\theta_G}\right)$$

where:

$$\Phi(y) = \int_{-\infty}^{y} \phi(x) dx, \quad \phi(x) = \frac{1}{\sqrt{2\pi}} \exp\left(-\frac{x^2}{2}\right);$$

and passes control to a function block 340. The function block 340 computes the volume $\Delta V_k$ of the k-th cell as a product of its dimensions, and passes control to a function block 345. The function block 345 increments the tightness probability $T_A$ by the contribution of the k-th cell as follows:

$$T_A = T_A + p(\Delta X_{k,N}) T_{A,k} * \Delta V_k,$$

and passes control to a function block 350. The function block 350 increments the value of k by 1 (i.e., k=k+1), and passes control to a decision block 355. The decision block 355 determines whether the current value of k is less than the number of cells. If the current value of k is less than the number of cells, then control is passed back to function block 320. Otherwise, if the current value of k is not less than the number of cells, then control is passed to an end block 360.

The complexity of the method of FIG. 3 depends only on the number of non-Gaussian parameters. Therefore, it is efficient for the case when we have many Gaussian and only a few non-Gaussian parameters, which is a frequent case in practice of statistical timing analysis.

A description will now be given regarding mean computation.

For arrival times A and B having first-order representations (Equation 10) the mean value $c_0$ of arrival time C=max(A,B) is defined as follows:

$$c_0 = \int_{-\infty}^{\infty} \max(A, B) p(\Delta X_N, \Delta X_G, \Delta R_a, \Delta R_b) d\Delta X_N d\Delta X_G d\Delta R_a d\Delta R_b \quad (21)$$

$p(\Delta X_N, \Delta X_G, \Delta R_a, \Delta R_b)$ is a joint probability density function of all the parameter variations. Using the independence of the parameters, this joint probability density function can be decomposed into a product of Gaussian and non-Gaussian density functions per Equation 14. Using this representation, the mean value of C=max(A,B) can be expressed in the following way:

$$c_0 = \int_{-\infty}^{\infty} p(\Delta X_N) \left( \int_{-\infty}^{\infty} \max(A, B) p(\Delta X_G, \Delta R_a, \Delta R_b) d\Delta X_G d\Delta R_a d\Delta R_b \right) d\Delta X_N \quad (22)$$

The inner integral is a function of variations with Gaussian distributions only. Denoting it as $D(\Delta X_N)$, this equation is transformed into:

$$c_0 = \int_{-\infty}^{\infty} D(\Delta X_N) p(\Delta X_N) d\Delta X_N \quad (23)$$

where $D(\Delta X_N)$ is the following integral:

$$D(\Delta X_N) = \int_{-\infty}^{\infty} \max(A, B) p(\Delta X_G, \Delta R_a, \Delta R_b) d\Delta X_G d\Delta R_a d\Delta R_b \quad (24)$$

Arrival times A and B can be considered as first-order representations $A_G$ and $B_G$ defined by Equation 19 with means defined by Equation 20. The means are functions of parameter variations with non-Gaussian distributions. In Equation 24, similar to the tightness probability computations, $\Delta X_N$ are considered to be parameters having a fixed value during the integration process. Then again, $A_G$ and $B_G$ can be considered as functions depending on parameter variations with only Gaussian distributions.

Integration in Equation 24 does not involve parameter variations with non-Gaussian distributions. Those variations are only external parameters assumed to be constant during the integration. That formula can be rewritten using $A_G$ and $B_G$ instead of A and B as follows:

$$D(\Delta X_N) = \int_{-\infty}^{\infty} \max(A_G, B_G) p(\Delta X_G, \Delta R_a, \Delta R_b) d\Delta X_G d\Delta R_a d\Delta R_b \quad (25)$$

Now it can be seen that it is an expression for the mean of $A_G$ and $B_G$ depending on parameter variations with only Gaussian distributions. Therefore, the results of the procedure 200 of FIG. 2 are applied and the analytical expression of Equation 8 is used for computing $D(\Delta X_N)$. Using that analytical expression for $D(\Delta X_N)$, the mean value for max(A,B) is computed by Equation 23 by numerical integration over the subspace of non-Gaussian parameter variations.

For example, in the simplest numerical integration approach, the mean value of C=max(A,B) is computed by the following method described herein below with respect to FIG. 4.

Figure 4:
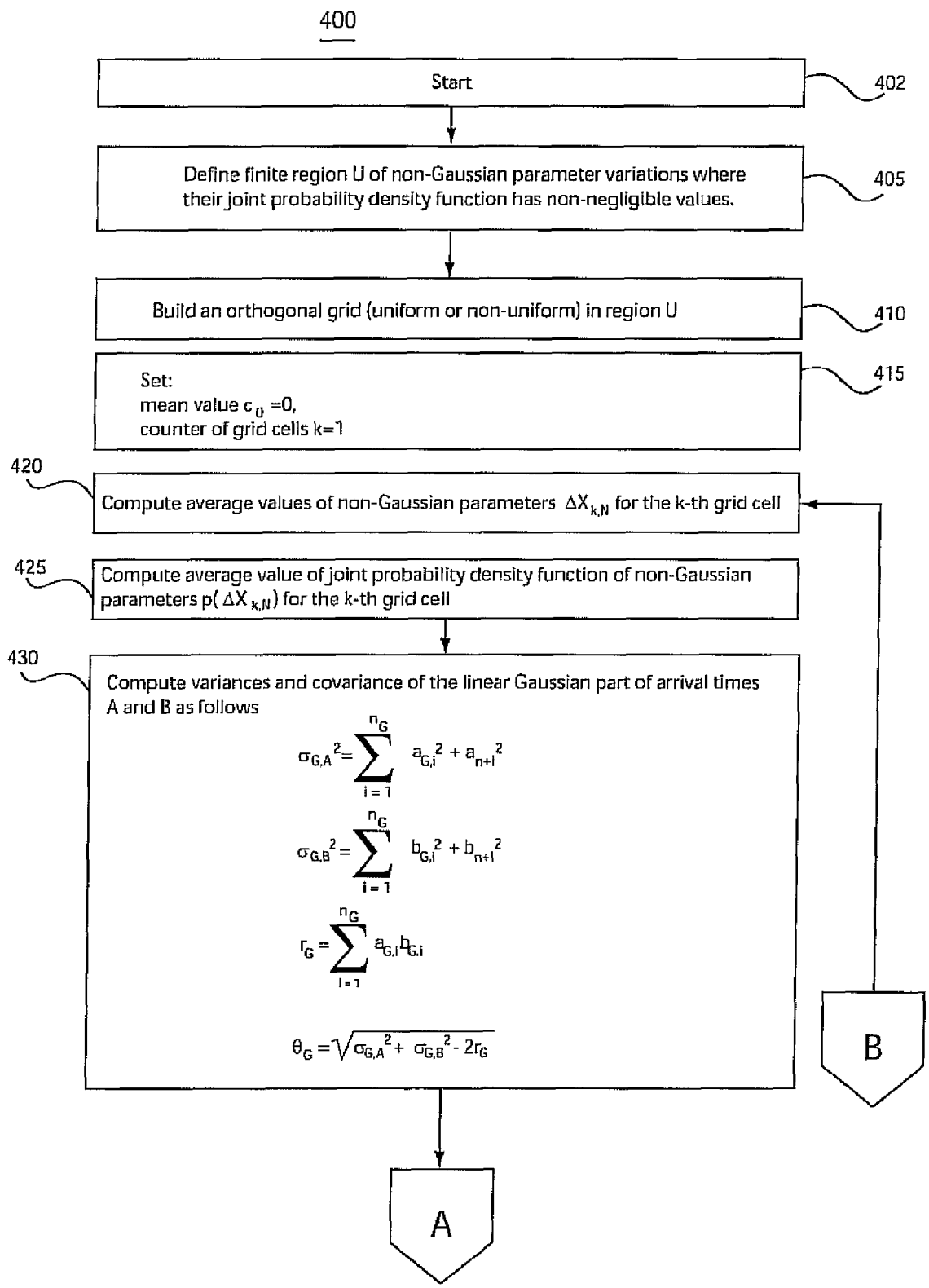
FIG. 4 is a flow diagram illustrating a method for computing a mean value of the maximum of two canonical forms with non-Gaussian parameters, according to an illustrative embodiment of the present invention.
Figure 4:
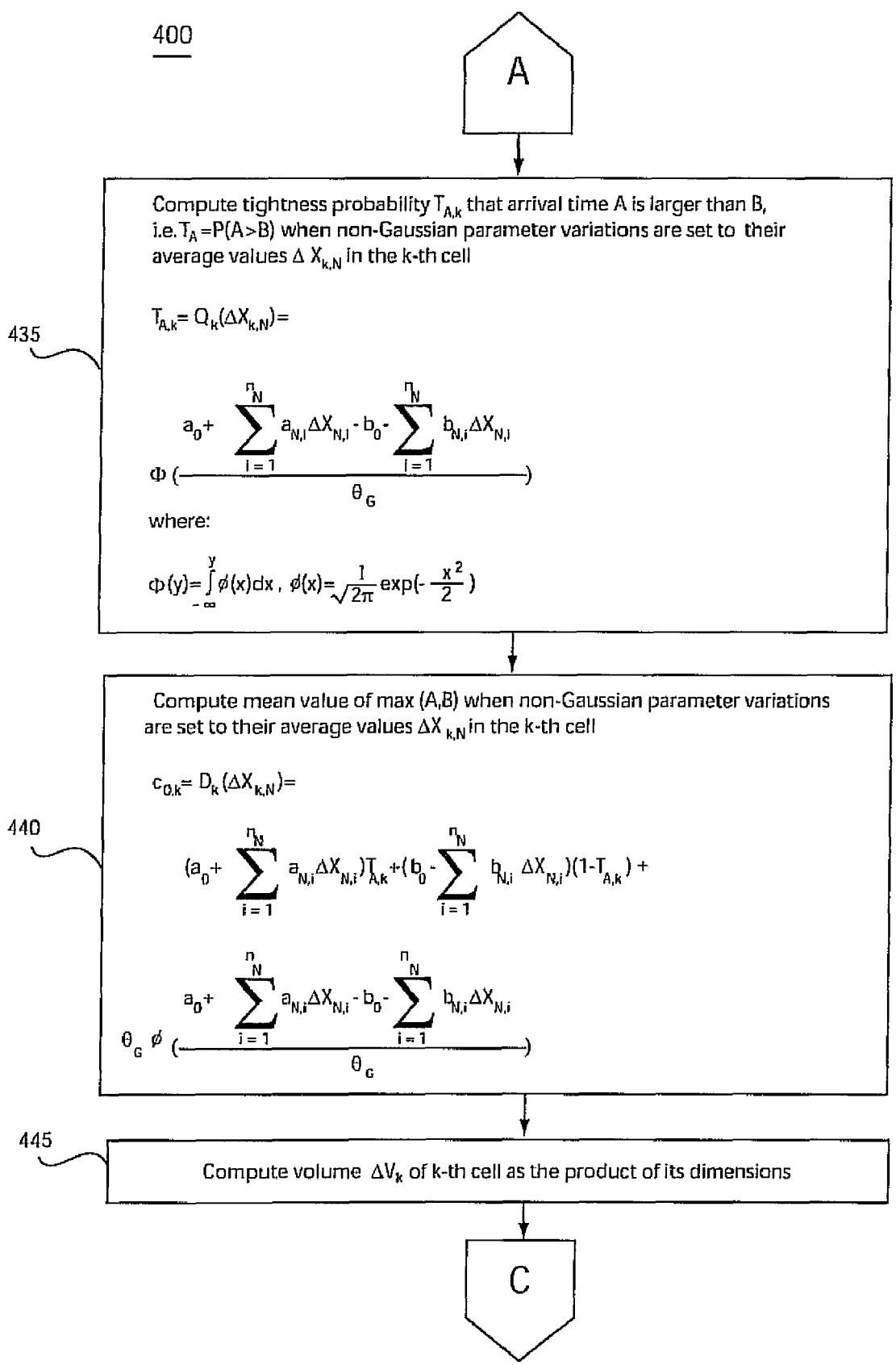
Figure 4:
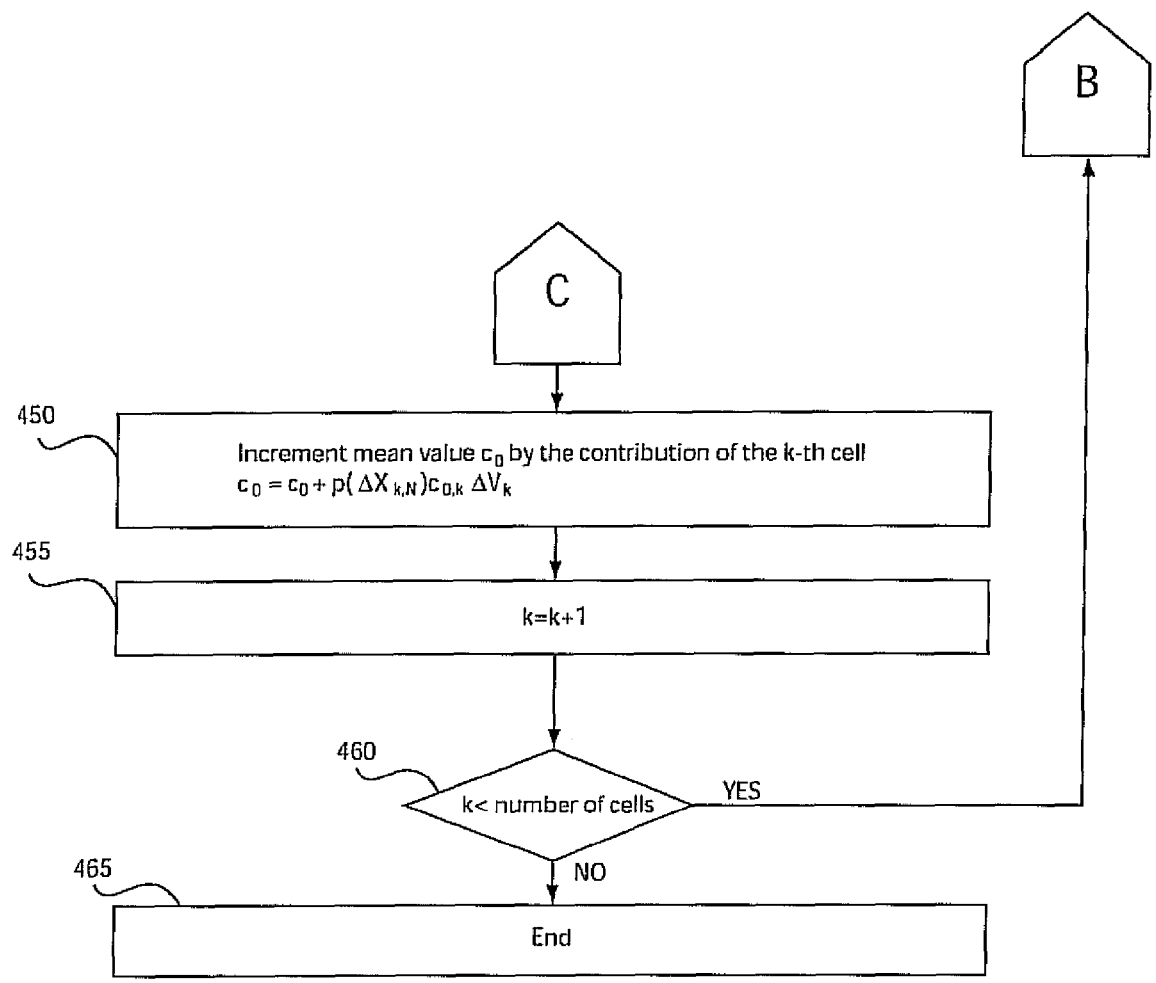

FIG. 4 is a flow diagram illustrating a method 400 for computing a mean value of the maximum of two canonical forms with non-Gaussian parameters, according to an illustrative embodiment of the present invention.

A start block 402 passes control to a function block 405. The function block 405 defines a finite region U of non-Gaussian parameter variations where their joint probability density function has non-negligible values, and passes control to a function block 410. The function block 410 builds an orthogonal grid (uniform or non-uniform) in region U, and passes control to a function block 415. The function block 415 sets the mean value $c_0=0$, sets a counter of grid cells k=1, and passes control to a function block 420. The function block 420 computes the average values of non-Gaussian parameters $\Delta X_{k,N}$ for the k-th grid cell, and passes control to a function block 425. The function block 425 computes the average value of the joint probability density function of non-Gaussian parameters $p(\Delta_{k,N})$ for the k-th grid cell, and passes control to a function block 430. The function block 430 computes variances and covariance of the linear Gaussian part of arrival times A and B as follows $$\sigma_{G,A}^2 = \sum_{i=1}^{n_G} a_{G,i}^2 + a_{n+1}^2$$

$$\sigma_{G,B}^2 = \sum_{i=1}^{n_G} b_{G,i}^2 + b_{n+1}^2$$

$$r_G = \sum_{i=1}^{n_G} a_{G,i} b_{G,i}$$

$$\theta_G = \sqrt{\sigma_{G,A}^2 + \sigma_{G,B}^2 - 2r_G},$$

and passes control to a function block 435. The function block 435 computes the tightness probability $T_{A,k}$ that arrival time A is larger than B, i.e., $T_A=P(A>B)$ when non-Gaussian parameter variations are set to their average values $\Delta X_{k,N}$ in the k-th cell as follows:

$$T_{A,k} = Q_k(\Delta X_{k,N})$$
$$= \Phi\left( \frac{a_0 + \sum_{i=1}^{n_N} a_{N,i} \Delta X_{N,i} - b_0 - \sum_{i=1}^{n_N} b_{N,i} \Delta X_{N,i}}{\theta_G} \right)$$

where:

$$\Phi(y) = \int_{-\infty}^{y} \phi(x) dx, \; \phi(x) = \frac{1}{\sqrt{2\pi}} \exp\left(-\frac{x^2}{2}\right),$$

and control passes to function block 440. The function block 440 computes the mean value of max(A,B) when non-Gaussian parameter variations are set to their average values $\Delta X_{k,N}$ in the k-th cell as follows:

$$C_{D,k} = D_k(\Delta X_{k,N})$$

$$= \left(a_0 + \sum_{i=1}^{n_N} a_{N,i}\Delta X_{N,i}\right)T_{A,k} + \left(b_0 + \sum_{i=1}^{n_N} b_{N,i}\Delta X_{N,i}\right)(1 - T_{d,k}) +$$

$$\theta_G\phi\left(\frac{a_0 + \sum_{i=1}^{n_N} a_{N,i}\Delta X_{N,i} - b_0 - \sum_{i=1}^{n_N} b_{N,i}\Delta X_{N,i}}{\theta_G}\right);$$

and passes control to a function block 445. The function block 445 computes the volume $\Delta V_k$ of the k-th cell as the product of its dimensions, and passes control to a function block 450. The function block 450 increments the mean value $c_0$ by the contribution of the k-th cell as follows:

$$c_0 = c_0 + p(\Delta X_{k,N})c_{0,k}\Delta V_k;$$

and passes control to a function block 455. The function block 455 increments the value of k by 1 (i.e., k=k+1), and passes control to a decision block 460. The decision block 460 determines whether the current value of k is less than the number of cells. If the current value of k is less than the number of cells, then control is passed back to function block 420. Otherwise, if the current value of k is not less than the number of cells, then control is passed to an end block 465.

The method of mean computation is very similar to the method of tightness probability computation. The major difference is only integration limits of the inner integral which does not depend on the values of non-Gaussian parameters and the integrand function of the inner integral which depends on non-Gaussian parameters.

A description will now be given regarding variance computation.

For variance computation, the same technique as for mean computation is used. To begin, the second moment of C=max (A,B) is computed by applying all the transformations described above with respect to the mean computation.

For arrival times A and B having first-order representations (Equation 10), the second moment of arrival time C=max(A, B) is defined as:

$$\hat{C}^2 = \int_{-\infty}^{\infty} (\max(A, B))^2 \tag{26}$$

$$p(\Delta X_N, \Delta X_G, \Delta R_a, \Delta R_b)\, d\Delta X_N d\, \Delta X_G d\, \Delta R_a d\, \Delta R_b$$

where $p(\Delta X_G, \Delta_N, \Delta R_a, \Delta R_b)$ is a joint probability density function for all the parameter variations. The joint probability density function is a product of Gaussian and non-Gaussian density functions per Equation 14. Using this representation, Equation 26 is rewritten as follows:

$$\hat{C}^2 = \int_{-\infty}^{\infty} p(\Delta X_N) \cdot \tag{27}$$

$$\left(\int_{-\infty}^{\infty} (\max(A, B))^2 p(\Delta X_G, \Delta R_a, \Delta R_b)\, d\Delta X_G d\Delta R_a d\, \Delta R_b\right)$$

$$d\, \Delta X_N$$

The inner integral is calculated over a Gaussian sub-space only. The inner integral depends on parameters having non-Gaussian distributions. This equation is rewritten as follows:

$$\hat{C}^2 = \int_{-\infty}^{\infty} F(\Delta X_N) p(\Delta X_n)\, d\Delta X_N \tag{28}$$

where:

$$F(\Delta X_N) = \int_{-\infty}^{\infty} (\max(A, B))^2 p(\Delta X_G, \Delta R_a, \Delta R_b) d\Delta X_G d\, \Delta R_a d\, \Delta R_b \tag{29}$$

Arrival times A and B can be considered as first-order forms $A_G$ and $B_G$ defined by Equation 19. Their means are defined by Equation 20 as a function of parameter variations with non-Gaussian distributions. $A_G$ and $B_G$ depend on parameter variations with only Gaussian distributions.

Integration in Equation 29 does not involve parameter variations with non-Gaussian distributions. Non-Gaussian variations are only external parameters assumed to be constant during the integration. This formula is rewritten using $A_G$ and $B_G$ instead of A and B as follows:

$$F(\Delta X_N) = \int_{-\infty}^{\infty} (\max(A_G, B_G))^2 p(\Delta X_G, \Delta R_a, \Delta R_b) d\Delta X_G d\, \Delta R_a d\, \Delta R_b \tag{30}$$

It is exactly a formula for the second moment of $\max(A_G, B_G)$ where $A_G$ and $B_G$ depend only on Gaussian parameters. It is known that the second moment can be expressed in terms of mean and variance. Using the analytical formulae for mean and variance per Equation 8, an analytical expression for $F(\Delta X_N)$ is obtained.

$$F(\Delta X_N) = (\sigma_{G,A}^2 + a_{G,0}^2)T_{G,A} + \tag{31}$$

$$(\sigma_{G,B}^2 + b_{G,0}^2)(1 - T_{G,A}) + (a_{G,0} + b_{G,0})\theta_G\phi\left(\frac{a_{G,0} - b_{G,0}}{\theta_G}\right)$$

where:

$A_G$ and $B_G$ are defined by equation 19, $a_{G,0}$, $b_{G,0}$, $\sigma_{G,A}^2$ and $\sigma_{G,B}^2$ are means and variances of $A_G$ and $B_G$, $T_{G,A}$ and $T_{G,B}$ are tightness probabilities of $A_G$ and $B_G$, and $\theta_G$ is a $\theta$ parameter for $A_G$ and $B_G$.

Using this formula for $F(\Delta X_N)$, the value of the second moment of C=max(A,B) is computed by Equation 28 performing numerical integration over the space of parameter variations with non-Gaussian distributions.

Using the second moment and mean, the variance is computed by subtracting the squared mean from the second moment. The method for computing the second moment is similar to the method of FIG. 4 for computing the mean value. The only difference is using analytical Equation 31 for variance $F(\Delta X_N)$ instead of the formula for mean.

A description will now be given regarding the first-order approximation of the maximum of arrival times depending both on linear and non-linear parameters.

The same ideas are used here as were applied for handling non-Gaussian parameters hereinabove. The first-order representation of arrival times A and B with non-linear parameters is further generalized as follows:

$$A = a_0 + \sum_{i=1}^{n_L} a_{L,i} \cdot \Delta X_{L,i} + f_A(\Delta X_{NL}) + a_{n+1} \cdot \Delta R_a \quad (32)$$

$$B = b_0 + \sum_{i=1}^{n_L} b_{L,i} \cdot \Delta X_{L,i} + f_B(\Delta X_{NL}) + b_{n+1} \cdot \Delta R_b$$

where: $\Delta X_{L,i}$ are linear parameters with Gaussian probability distribution; $\Delta X_{NL,i}$ are non linear parameters with arbitrary probability distribution; $f_A$ and $f_B$ are arbitrary functions describing dependence of arrival times on non-linear parameters (these functions can be represented, for example, by tables using a discretization approach); and $\Delta R_a$ and $\Delta R_b$ are parameters responsible for uncorrelated variation of the arrival times. They are assumed linear and Gaussian.

Incrementing an arrival time given in the form of Equation 12 by a gate delay given in the same form is obvious. Similar to the pure Gaussian case described in the System and Method for Statistical Timing Analysis of Digital Circuits patent, corresponding coefficients of the first-order forms representing arrival time and gate delay are summed. Summation of non-linear terms is not very difficult if they are represented by tables.

A much more difficult problem is to derive an approximate first-order representation for $C=\max(A,B)$:

$$C_{appr} = c_0 + \sum_{i=1}^{n_L} c_{L,i} \cdot \Delta X_{L,i} + f_C(\Delta X_{NL}) + c_{n+1} \cdot \Delta R_c \quad (33)$$

having the same mean and variance values as the actual $C=\max(A,B)$. It is solved by computing proper values of $c_0$, $c_{L,i}$, $c_{n+1}$ and a proper function $f_C$.

First, the tightness probability $T_A$ is computed, which is the probability that arrival time A is more than arrival time B. Then, coefficients $c_{L,i}$ are expressed as linear combinations of coefficients $a_{L,i}$ and $b_{L,i}$ as follows:

$$c_{L,i} = T_A \cdot a_{L,i} + (1 - T_A) \cdot b_{L,i} \quad (34)$$

Similarly, function $f_C(\Delta X_{NL})$ is expressed as a linear combination of functions $f_A$ and $f_B$ as follows:

$$f_C(\Delta X_{NL}) = T_A f_A(\Delta X_{NL}) + (1 - T_A) f_B(\Delta X_{NL}) \quad (35)$$

After that, coefficients $c_0$ and $c_{n+1}$ are computed so that the mean and variance values for $C_{appr}$ are exactly the same as for the actual $C=\max(A,B)$.

Implementation of this approach requires computing the following: tightness probability $T_A$; and mean and variance of $C=\max(A,B)$. These values are computed by separating the integration over the subspace of linear Gaussian parameters $\Delta X_L$ and over the subspace of the other parameters. The integration over the subspace of Gaussian parameters can be done analytically. The integration over the subspace of non-linear and/or non-Gaussian parameters is done numerically.

A description will now be given regarding the tightness probability computation.

For arrival times A and B, having first-order representations per Equation 32, the tightness probability $T_A = P(A>B) = P(B-A<0)$ is defined as:

$$T_A = \int_{B-A<0} p(\Delta X_{NL}, \Delta X_L, \Delta R_a, \Delta R_b) \cdot d\Delta X_{NL} \cdot d\Delta X_L \cdot d\Delta R_a \cdot d\Delta R_b \quad (36)$$

where $p(\Delta X_{NL}, \Delta X_L, \Delta R_a, \Delta R_b)$ is the joint probability density function of all the parameter variations. Using parameter independence, this joint probability density function can be decomposed into a product of two joint density functions $$p(\Delta X_{NL}, \Delta X_L, \Delta R_a, \Delta R_b) = p(\Delta X_{NL}) \cdot p(\Delta X_L, \Delta R_a, \Delta R_b) \quad (37)$$

One of the two joint density functions is a joint probability density function of linear Gaussian parameters, including parameters responsible for uncorrelated variations. The other one is a joint probability density function of all the other parameters.

Substituting expressions per Equation 32 for A and B in inequality $B-A<0$ and rearranging terms, the following inequality is obtained:

$$\sum_{i=1}^{n_L} (b_{L,i} - a_{L,i}) \Delta X_{L,i} + b_{n+1} \Delta R_b - a_{n+1} \Delta R_a < \quad (38)$$

$$a_0 - b_0 + f_A(\Delta X_{NL}) - f_B(\Delta X_{NL})$$

This form of the inequality $B-A<0$ is used to define the integration region in Equation 36. Using the representation of probability density function as a product of two parts per Equation 37, the tightness probability per Equation 36 is represented as follows:

$$T_A = \int_{-\infty}^{\infty} p(\Delta X_{NL}) Q(\Delta X_{NL}) d\Delta X_{NL} \quad (39)$$

where $Q(\Delta X_{NL})$ is the following integral:

$$Q(\Delta X_{NL}) = \quad (40)$$

$$\int_{\substack{\sum_{i=1}^{n_L}(b_{L,i}-a_{L,i})\Delta X_{L,i} - \\ a_{n+1}\Delta R_a + b_{n+1}\Delta R_b < a_0 - b_0 + \\ f_A(\Delta X_{NL}) - f_B(\Delta X_{NL})}} p(\Delta X_L, \Delta R_a, \Delta R_b) d\Delta X_L d\Delta R_a d\Delta R_b$$

The integration here is performed over the subspace of linear Gaussian parameters. It is performed over the region constructed by the cross section of the region $B-A<0$ of the whole variation space with the hyper-plane $\Delta X_{NL}$=const. "const" means a vector of values that does not vary during the integration. In other words, $Q(\Delta X_{NL})$ is a conditional probability $P(B-A<0|\Delta X_{NL}=\text{const})$, i.e., the probability that $B-A<0$ at the condition of fixed values $\Delta X_{NL}$.

It can be seen that $Q(\Delta X_{NL})$ can be considered as the tightness probability of variables $A_L$ and $B_L$:

$$A_L = a_{L,0} + \sum_{i=1}^{n_L} a_{L,i} \Delta X_{L,i} + a_{n+1} \Delta R_a \quad (41)$$

$$B_L = b_{L,0} + \sum_{i=1}^{n_L} b_{L,i} \Delta X_{L,i} + b_{n+1} \Delta R_b$$

where $a_{L,0}$ and $b_{L,0}$ are mean values of $A_L$ and $B_L$:

$$a_{L,0} = a_0 + f_A(\Delta X_{NL}) \quad (42)$$

$$b_{L,0} = b_0 + f_B(\Delta X_{NL})$$

Here $\Delta X_{NL}$ is considered not as a vector of random variables but as a vector of parameters having constant values during tightness probability computation. In fact, $A_L$ and $B_L$ are exactly A and B where $\Delta X_{NL}$ are considered as fixed parameters rather than random variables.

$A_L$ and $B_L$ depend only on linear parameter variations having Gaussian distributions. Therefore, $Q(\Delta X_{NL})$ is computed analytically using Equation 7.

Substituting the analytical expression for $Q(\Delta X_{NL})$ into Equation 39, the tightness probability $T_A$ is computed by numerical integration over the subspace of non-linear and/or non-Gaussian parameters variations $\Delta X_{NL}$. The numerical integration can be performed using any known method for multidimensional numerical integration. For example, in the simple case of a numerical integration approach, the tightness probability can be computed by the following generalization of the method of FIG. 3 described herein below with respect to FIG. 5.

Figure 5:
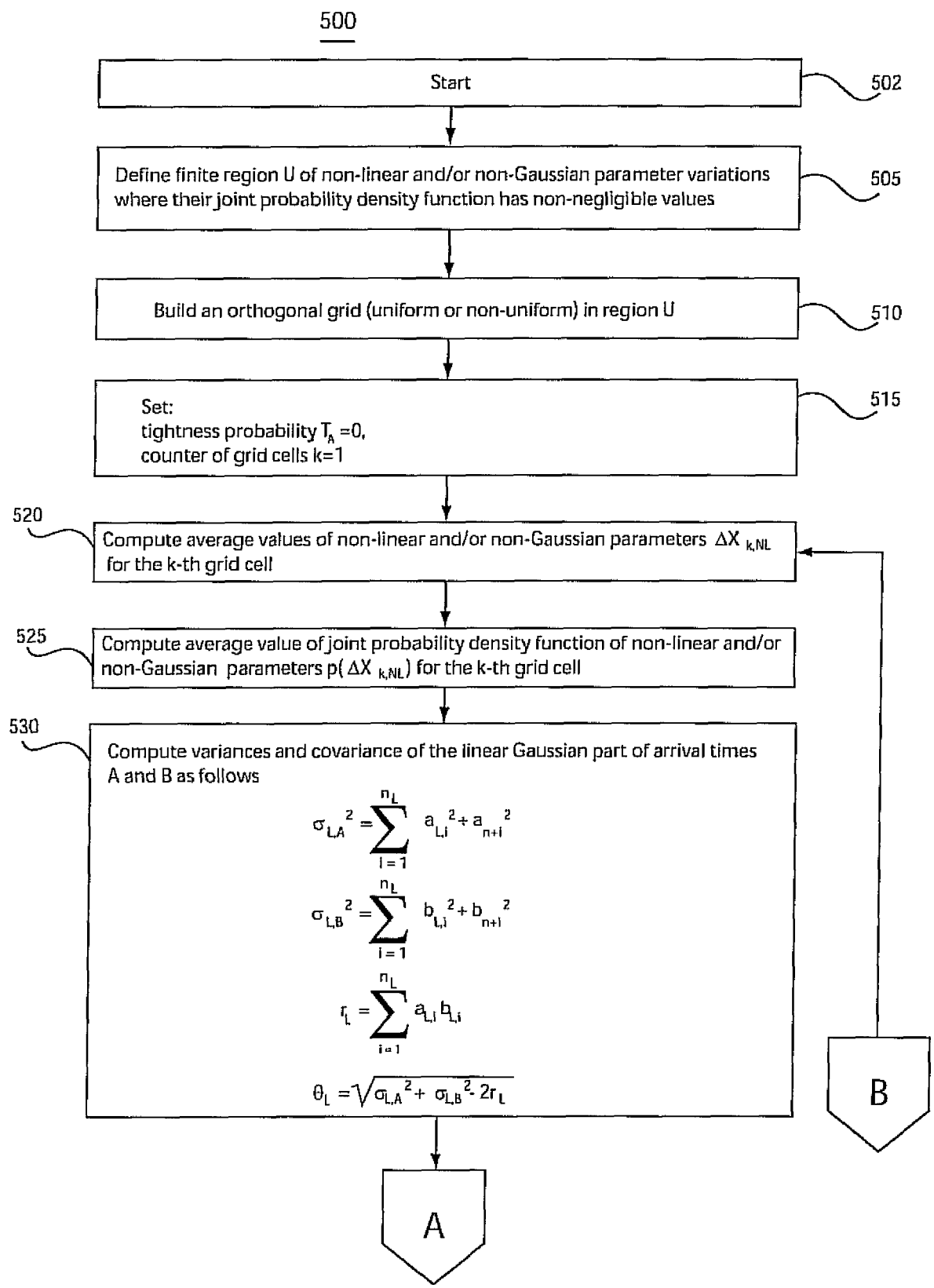
FIG. 5 is a flow diagram illustrating a method for computing a tightness probability with non-linear and/or non-Gaussian parameters, according to an illustrative embodiment of the present invention.

FIG. 5 is a flow diagram illustrating a method 500 for computing a tightness probability with non-linear and/or non-Gaussian parameters, according to an illustrative embodiment of the present invention.

A start block 502 passes control to a function block 505. The function block 505 defines a finite region U of non-linear and/or non-Gaussian parameter variations where their joint probability density function has non-negligible values, and passes control to a function block 510. The function block 510 builds an orthogonal grid (uniform or non-uniform) in region U, and passes control to a function block 515. The function block 515 sets the tightness probability $T_A$=0, sets a counter of grid cells k=1, and passes control to a function block 520. The function block 520 computes the average values of non-linear and/or non-Gaussian parameters $\Delta X_{k,NL}$ for k-th grid cell, and passes control to a function block 525. The function block 525 computes the average value of the joint probability density function of non-linear and/or non-Gaussian parameters $p(\Delta X_{k,NL})$ for the k-th grid cell, and passes control to a function block 530. The function block 530 computes the variances and covariance of the linear Gaussian part of arrival times A and B as follows:

$$\sigma_{L,A}^2 = \sum_{i=1}^{n_L} a_{L,i}^2 + a_{n+1}^2$$

$$\sigma_{L,B}^2 = \sum_{i=1}^{n_L} b_{L,i}^2 + b_{n+1}^2$$

$$r_L = \sum_{i=1}^{n_L} a_{L,i} b_{G,i}$$

$$\theta_L = \sqrt{\sigma_{L,A}^2 + \sigma_{L,B}^2 - 2r_L};$$

and passes control to a function block 535. The function block 535 computes the tightness probability $T_{A,k}$ that arrival time A is larger than B, i.e., $T_A$=P(A>B) when non-linear and/or non-Gaussian parameter variations are set equal to their average values $\Delta X_{k,NL}$ in the k-th cell as follows:

$$T_{A,k} = Q_k(\Delta X_{k,NL}) = \Phi\left(\frac{a_0 + f_A(\Delta X_{NL}) - b_0 - f_B(\Delta X_{NL})}{\theta_L}\right)$$

$$\text{where: } \Phi(y) = \int_{-\infty}^{y} \phi(x)\,dx,\ \phi(x) = \frac{1}{\sqrt{2\pi}} \exp\left(-\frac{x^2}{2}\right);$$

and passes control to a function block 540. The function block 540 computes the volume $\Delta V_k$ of the k-th cell as the product of its dimensions, and passes control to a function block 545. The function block 545 increments the tightness probability $T_A$ by the contribution of the k-th cell as follows:

$$T_A = T_A + p(\Delta X_{k,NL}) T_{A,k} \Delta V_k;$$

and passes control to a function block 550. The function block 550 increments the value of k by 1 (i.e., k=k+1), and passes control to a decision block 555. The decision block 555 determines whether the current value of k is less than the number of cells. If the current value of k is less than the number of cells, then control is passed back to function block 520. Otherwise, if the current value of k is not less than the number of cells, then control is passed to an end block 560.

The complexity of the method of FIG. 5 depends only on the number of the parameters that are non-linear and/or non-Gaussian. Therefore, the method is very efficient when we have many Gaussian linear parameters and only a few others, which is frequently the case in statistical timing analysis.

A description will now be given regarding mean computation.

For arrival times A and B having first-order representations (Equation 32) the mean value $c_0$ of arrival time C=max(A,B) is defined as follows:

$$c_0 = \int_{-\infty}^{\infty} \max(A,B) p(\Delta X_{NL}, \Delta X_L, \Delta R_a, \Delta R_b) \quad (43)$$

$$d\Delta X_{NL} d\Delta X_L d\Delta R_a d\Delta R_b$$

where $p(\Delta X_L, \Delta X_{NL}, \Delta R_a, \Delta R_b)$ is the joint probability density function of all the parameter variations. Using parameter independence, the joint probability density function can be decomposed into a product of two joint probability density functions per Equation 37. Using this representation, the mean value of C=max(A,B) is expressed as follows:

$$c_0 = \int_{-\infty}^{\infty} p(\Delta X_{NL}) \quad (44)$$

$$\left(\int_{-\infty}^{\infty} \max(A,B) p(\Delta X_L, \Delta R_a, \Delta R_b) d\Delta X_L d\Delta R_a d\Delta R_b\right) d\Delta X_{NL}$$

The inner integral is a function of non-linear and/or non-Gaussian parameters. This equation is transformed into:

$$c_0 = \int_{-\infty}^{\infty} D(\Delta X_{NL}) p(\Delta X_{NL}) d\Delta X_{NL} \quad (45)$$

where $D(\Delta X_{NL})$ is the following integral:

$$D(\Delta X_{NL}) = \int_{-\infty}^{\infty} \max(A,B) p(\Delta X_L, \Delta R_a, \Delta R_b) d\Delta X_L d\Delta R_a d\Delta R_b \quad (46)$$

Arrival times A and B can be considered to be first-order representations $A_L$ and $B_L$ defined by Equation 41 with means defined by Equation 42. The means are functions of non-linear and/or non-Gaussian parameter variations. Therefore, $A_L$ and $B_L$ can be considered as functions of linear parameters with Gaussian distributions.

In Equation 46, similarly to the tightness probability computations, $\Delta X_{NL}$ are considered as parameters having fixed values during the integration process. Integration in Equation 46 involves only linear Gaussian parameters. This formula is rewritten using $A_L$ and $B_L$ instead of A and B as follows:

$$D(\Delta X_{NL}) = \int_{-\infty}^{\infty} \max(A_L, B_L) p(\Delta X_L, \Delta R_a, \Delta R_b) d\Delta X_L d\Delta R_a d\Delta R_b \quad (47)$$

Now using the fact that $A_L$ and $B_L$ depend only on linear parameter variations with Gaussian distributions, the analytical expression of Equation 8 can be used for computing $D(\Delta X_{NL})$. Using that analytical expression, the mean value of max(A,B) is computed by Equation 45, performing numerical integration over the space of non-linear and/or non-Gaussian parameters.

For the simplest numerical integration approach, the tightness probability can be computed by the following generalization of the method of FIG. 4 described herein after with respect to FIG. 6.

Figure 6:
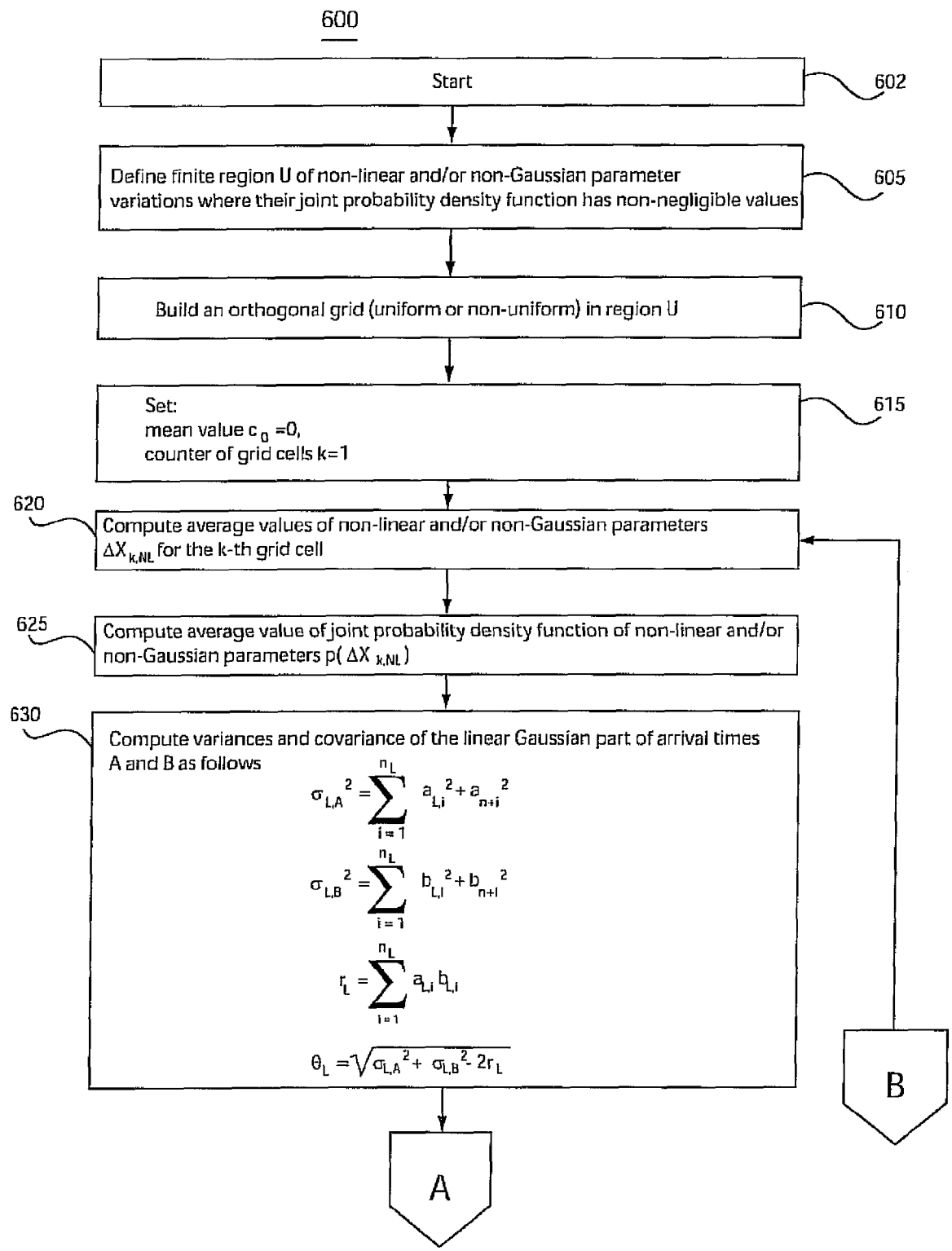
FIG. 6 is a flow diagram illustrating a method for computing the mean value of the maximum of two canonical forms with non-linear and/or non-Gaussian parameters, according to an illustrative embodiment of the present invention.
Figure 6:
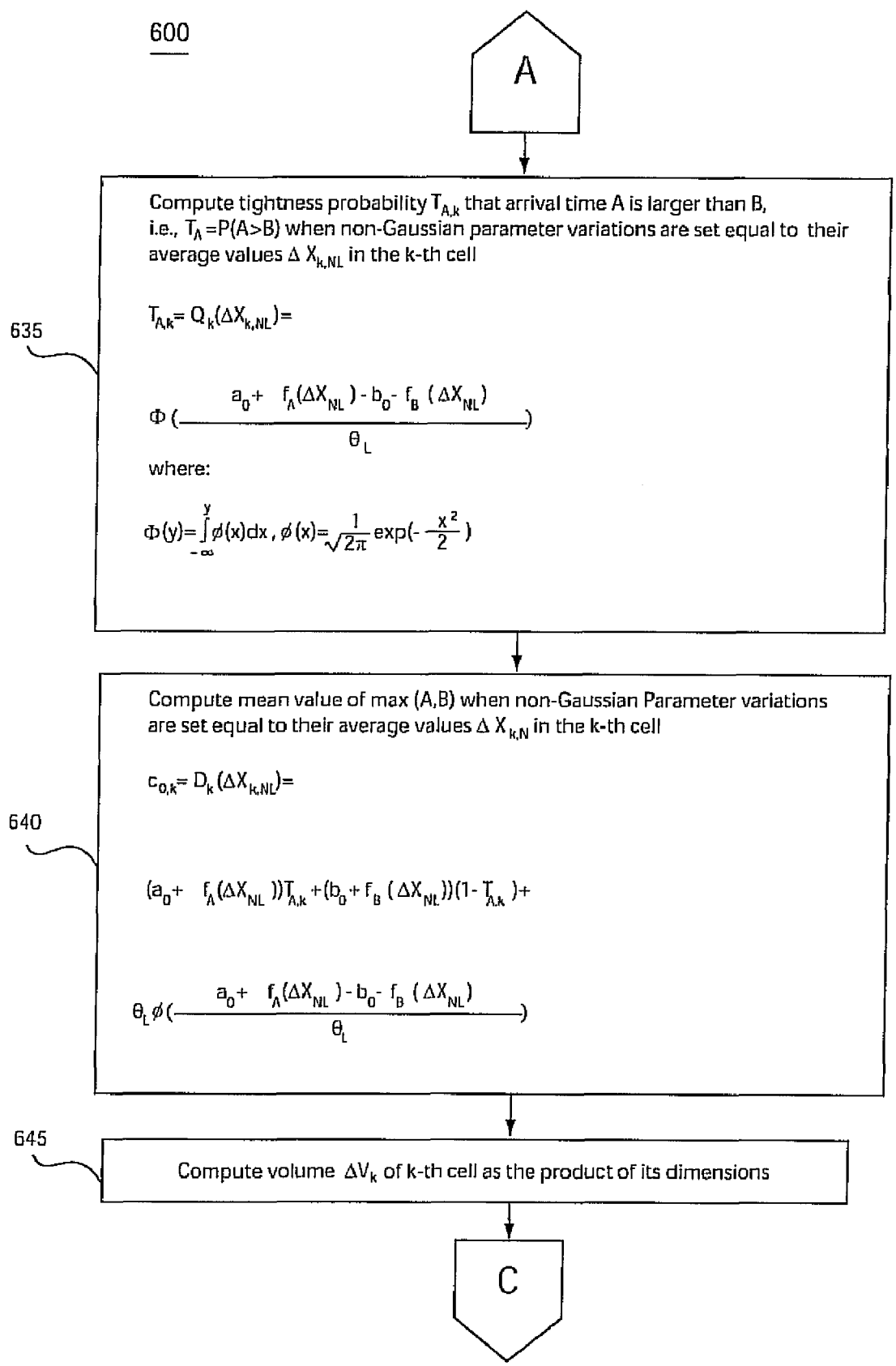
Figure 6:
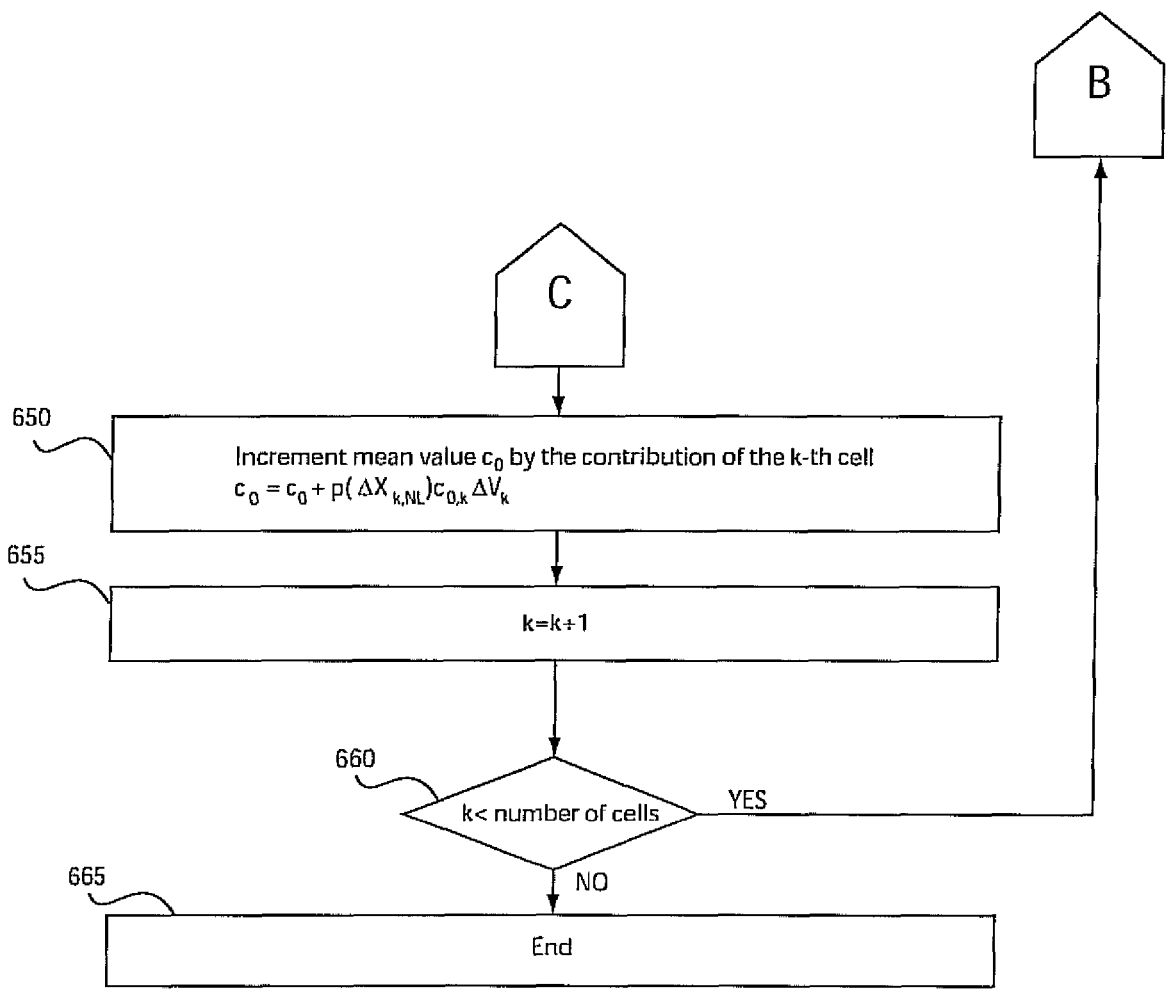

FIG. 6 is a flow diagram illustrating a method for computing the mean value of the maximum of two canonical forms with non-linear and/or non-Gaussian parameters, according to an illustrative embodiment of the present invention.

A start block 602 passes control to a function block 605. The function block 605 defines a finite region U of non-linear and/or non-Gaussian parameter variations where their joint probability density function has non-negligible values, and passes control to a function block 610. The function block 610 builds an orthogonal grid (uniform or non-uniform) in region U, and passes control to a function block 615. The function block 615 sets the mean value $c_0$=0, sets a counter of grid cells k=1, and passes control to a function block 620. The function block 620 computes the average values of non-linear and/or non-Gaussian parameters $\Delta X_{k,NL}$ for the k-th grid cell, and passes control to a function block 625. The function block 625 computes the average value of the joint probability density function of non-linear and/or non-Gaussian parameters $p(\Delta X_{k,NL})$, and passes control to a function block 630. The function block 630 computes the variances and covariance of the linear Gaussian part of arrival times A and B as follows:

$$\sigma_{L,A}^2 = \sum_{i=1}^{n_L} a_{L,i}^2 + a_{n+1}^2$$

$$\sigma_{L,B}^2 = \sum_{i=1}^{n_L} b_{L,i}^2 + b_{n-1}^2$$

$$r_L = \sum_{i=1}^{n_L} a_{L,i} b_{L,i}$$

$$\theta_L = \sqrt{\sigma_{L,A}^2 + \sigma_{L,B}^2 - 2r_L} \ ;$$

and passes control to a function block 635. The function block 635 computes the tightness probability $T_{A,k}$ that arrival time A is larger than B, i.e., $T_A$=P(A>B) when non-Gaussian parameter variations are set equal to their average values $\Delta X_{k,N}$ in the k-th cell as follows:

$$T_{A,k} = Q_k(\Delta X_{k,NL}) = \Phi\left(\frac{a_0 + f_A(\Delta X_{NL}) - b_0 - f_B(\Delta X_{NL})}{\theta_L}\right)$$

$$\text{where: } \Phi(y) = \int_{-\infty}^{y} \phi(x) dx, \ \phi(x) = \frac{1}{\sqrt{2\pi}} \exp\left(-\frac{x^2}{2}\right);$$

and passes control to a function block 640. The function block 640 computes the mean value of max(A,B) with non-Gaussian parameter variations set equal to their average values $\Delta X_{k,NL}$ in the k-th cell as follows:

$$c_{0,k} = D_k(\Delta X_{k,NL}) = (a_0 + f_A(\Delta X_{NL}))T_{A,k} +$$
$$(b_0 + f_B(\Delta X_{NL}))(1 - T_{A,k}) + \theta_L \phi\left(\frac{a_0 + f_A(\Delta X_{NL}) - b_0 - f_B(\Delta X_{NL})}{\theta_L}\right);$$

and passes control to a function block 645. The function block 645 computes the volume $\Delta V_k$ of the k-th cell as the product of its dimensions, and passes control to a function block 650. The function block 650 increments the mean value $c_0$ by the contribution of the k-th cell as follows:

$$c_0 = c_0 + p(\Delta X_{k,NL}) c_{0,k} \Delta V_k;$$

and passes control to a function block 655. The function block 655 increments the value of k by 1 (i.e., k=k+1), and passes control to a decision block 660. The decision block 660 determines whether the current value of k is less than the number of cells. If the current value of k is less than the number of cells, then control is passed back to function block 620. Otherwise, if the current value of k is not less than the number of cells, then control is passed to an end block 665.

The method for mean computation is very similar to the method for the tightness probability computation. The major difference is only the integration limits of the inner integrand which do not depend on the values of non-Gaussian parameters and the integrant function of the inner integral which depends on non-Gaussian parameters.

A description will now be given regarding variance computation.

For variance computation, the same technique is used as that for mean computation. Initially, the second moment of C=max(A,B) is computed by applying all the transformations described above with respect to mean computation.

For arrival times A and B having first-order representations per Equation 32, the second moment of arrival time C=max(A,B) is defined as follows:

$$\hat{C}^2 = \int_{-\infty}^{\infty} (\max(A, B))^2 p(\Delta X_{NL}, \Delta X_L, \Delta R_a, \Delta R_b) \quad (48)$$
$$d\Delta X_{NL} d\Delta X_L d\Delta R_a d\Delta R_b$$

where $p(\Delta X_{NL}, \Delta X_L, \Delta R_a, \Delta R_b)$ is the joint probability density function for all the parameter variations. Using parameter independence, the joint probability density function is decomposed into a product of two joint probability density functions per Equation 37. Using this representation, Equation 48 is rewritten as follows:

$$\hat{C}^2 = \int_{-\infty}^{\infty} p(\Delta X_{NL}) \cdot \quad (49)$$
$$\left(\int_{-\infty}^{\infty} (\max(A, B))^2 p(\Delta X_L, \Delta R_a, \Delta R_b) d\Delta X_L d\Delta R_a d\Delta R_b\right) d\Delta X_{NL}$$

The inner integral is performed over the space of linear Gaussian parameters. This equation is rewritten as follows:

$$\hat{C}^2 = \int_{-\infty}^{\infty} F(\Delta X_{NL}) p(\Delta X_{NL}) d\Delta X_{NL} \quad (50)$$

where:

$$F(\Delta X_{NL}) = \int_{-\infty}^{\infty} (\max(A, B))^2 p(\Delta X_L, \Delta R_a, \Delta R_b) d\Delta X_L d\Delta R_a d\Delta R_b \quad (51)$$

Using Equation 41, arrival times A and B can be considered as first-order forms $A_L$ and $B_L$ of linear Gaussian parameters. Their means are defined by Equation 42 as a function of non-linear and/or non-Gaussian parameters.

Integration in Equation 51 involves only linear parameter variations with Gaussian distributions. Non-linear and non-Gaussian parameters are only external parameters assumed to be constant during the integration. This formula is rewritten using $A_L$ and $B_L$ instead of A and B:

$$F(\Delta X_{NL}) = \int_{-\infty}^{\infty} (\max(A_L, B_L))^2 p(\Delta X_L, \Delta R_a, \Delta R_b) d\Delta X_L d\Delta R_a d\Delta R_b \quad (52)$$

It is exactly a formula for the second moment of $\max(A_L, B_L)$, where $A_L$ and $B_L$ depend only on linear Gaussian parameters. Using the expression of the second moment through mean and variance and applying analytical formulas for mean and variance per Equation 8, the analytical expression for $F(\Delta X_{NL})$ is obtained as follows:

$$F(\Delta X_{NL}) = (\sigma_{L,A}^2 + a_{L,0}^2) T_{L,A} + \quad (53)$$
$$(\sigma_{L,B}^2 + b_{L,0}^2)(1 - T_{L,A}) + (a_{L,0} + b_{L,0}) \theta_L \phi\left(\frac{a_{L,0} - b_{L,0}}{\theta_L}\right)$$

where:
$A_L$ and $B_L$ defined by Equation 41, $a_{L,0}$, $b_{L,0}$, $\sigma_{L,A}^2$ and $\sigma_{L,B}^2$ are the means and variances of $A_L$ and $B_L$, $T_{L,A}$ and $T_{L,B}$ are the tightness probabilities of $A_L$ and $B_L$, and $\theta_L$ is a $\theta$ parameter for $A_L$ and $B_L$.

Using this formula for $F(\Delta X_{NL})$, the value of the second moment of $C=\max(A,B)$ is computed by Equation 50, performing numerical integration over the space of parameter variations with non-Gaussian distributions.

Using the second moment and mean, the variance is computed by subtracting the squared mean from the second moment. The method for computing the second moment is similar to the method of FIG. 6 for computing the mean value.

Figure 7:
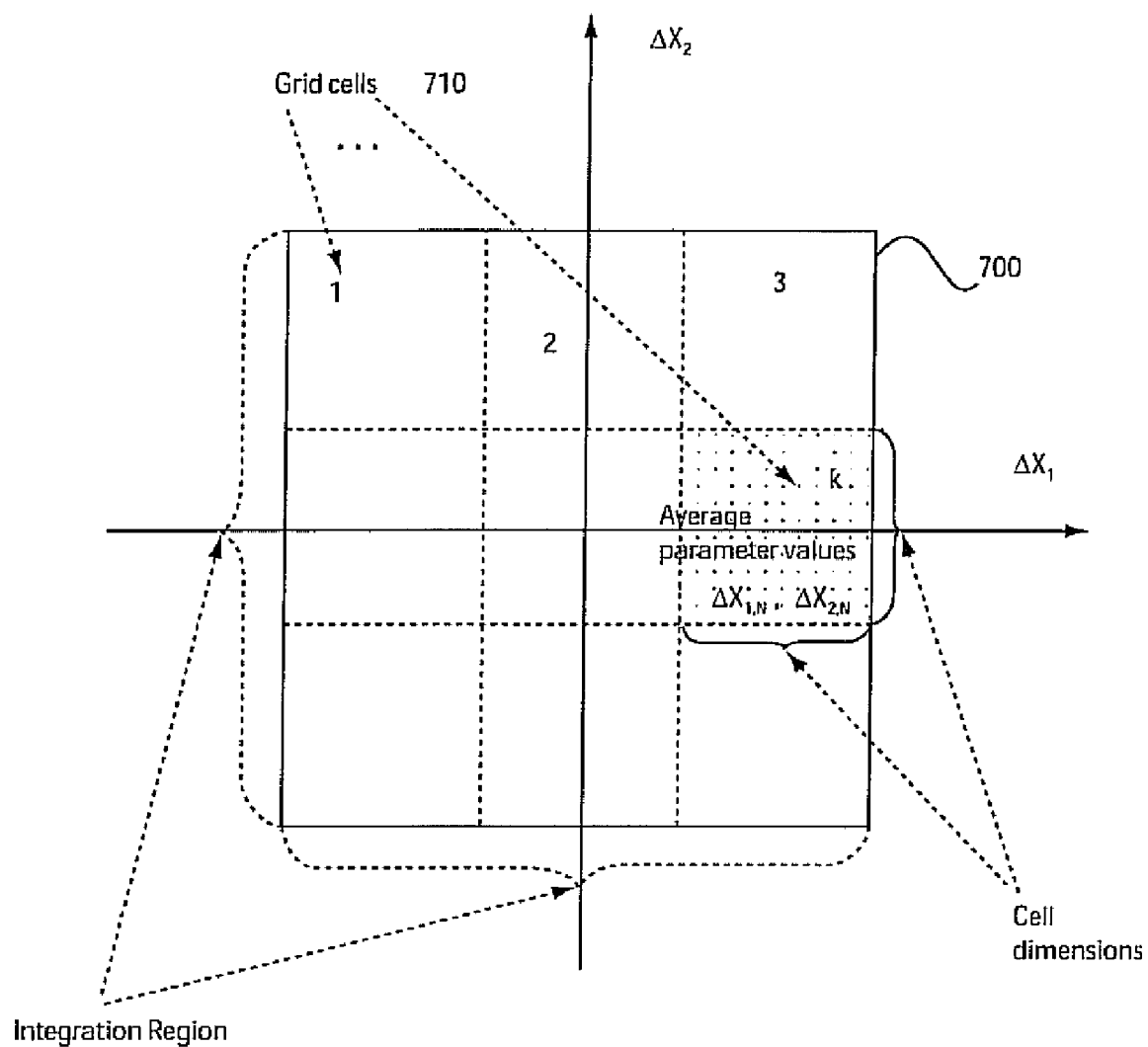
FIG. 7 is a diagram illustrating a grid 700 for numerical integration over a region of non-Gaussian and/or non-linear parameters, according to an illustrative embodiment of the present invention.

FIG. 7 is a diagram illustrating a grid 700 for numerical integration over a region of non-Gaussian and/or non-linear parameters, according to an illustrative embodiment of the present invention. The integration region has two dimensions corresponding to process parameters variations $\Delta X_1$ and $\Delta X_2$. This example shows a grid consisting of 9 cells 710. However, for reasonable accuracy, the numerical integration usually uses a finer grid with a larger number of cells.

While the description of the present invention provided herein focused on the max operation, it is to be appreciated that one of ordinary skill in the art can apply the teaching to a min operation. Moreover, while the description of the present invention provided herein focused on the computation of the latest arrival time, it is to be appreciated that one of ordinary skill in the art can apply the teaching to a computation of the earliest arrival time. Further, while the description of the present invention provided herein focused on combinational circuits, it is to be appreciated that one of ordinary skill in the art can apply the teaching to sequential circuits. Additionally, while the description of the present invention provided herein focused on the case when a gate delay is a separable function, it is to be appreciated that one of ordinary skill in the art can apply the teaching to a case when a gate delay is a non-separable function.

These and other features, advantages, and variations of the present invention may be readily ascertained by one of ordinary skill in the pertinent art based on the teachings herein. It is to be understood that the teachings of the present invention may be implemented in various forms of hardware, software, firmware, special purpose processors, or combinations thereof.

Most preferably, the teachings of the present invention are implemented as a combination of hardware and software. Moreover, the software is preferably implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present invention is programmed. Given the teachings herein, one of ordinary skill in the pertinent art will be able to contemplate these and similar implementations or configurations of the present invention.

Although the illustrative embodiments have been described herein with reference to the accompanying drawings, it is to be understood that the present invention is not limited to those precise embodiments, and that various changes and modifications may be effected therein by one of ordinary skill in the pertinent art without departing from the scope or spirit of the present invention. All such changes and modifications are intended to be included within the scope of the present invention as set forth in the appended claims.

What is claimed is:

1. A system for statistical timing analysis and optimization of an electrical circuit having two or more digital elements, comprising:
    at least one parameter input for receiving parameters of the electrical circuit, at least one of the parameters having a non-Gaussian probability distribution; and
    a statistical static timing analyzer and electrical circuit optimizer for calculating at least one of a signal arrival time and a signal required time for the electrical circuit using the at least one of the parameters having the non-Gaussian probability distribution, and for modifying a component size of the electrical circuit to alter gate timing characteristics of the electrical circuit based upon the at least one of the signal arrival time and the signal required time.

2. The system according to claim 1, wherein the signal arrival time is one of a minimum signal arrival time and a maximum signal arrival time, and the signal required time is one of a minimum signal required time and a maximum signal required time.

3. The system according to claim 1, wherein said statistical static timing analyzer calculates the at least one of the signal arrival time and the signal required time by separately integrating over subspaces of parameters with Gaussian probability distributions and subspaces of parameters with non-Gaussian probability distributions.

4. The system according to claim 3, wherein said statistical static timing analyzer performs integration over the subspaces of parameters with Gaussian probability distributions analytically and over the subspaces of parameters with non-Gaussian probability distributions numerically.

5. The system according to claim 1, wherein said statistical static timing analyzer calculates the at least one of the signal arrival time by calculating a probability that a signal arrival time A in the electrical circuit is one of greater than and less than a signal arrival time B in the electrical circuit and the signal required time by calculating a probability that a signal required time A in the electrical circuit is one of greater than and less than a signal required time B in the electrical circuit, using the at least one of the parameters having the non-Gaussian probability distribution.

6. The system according to claim 1, wherein said statistical static timing analyzer calculates the at least one of the signal arrival time and the signal required time by defining a finite region of non-Gaussian parameter variations and building an integration grid in the finite region.

7. The system according to claim 6, wherein the integration grid has a plurality of cells, and said statistical static timing analyzer calculates a tightness probability, a mean value, and a second moment value for each of the plurality of cells.

8. The system according to claim 7, wherein the tightness probability, the mean value, and the second moment value are calculated for each of the plurality of cells at a condition wherein the at least one of the parameters having the non-Gaussian probability distribution is fixed to be equal to an average value of the at least one of the parameters in a corresponding one of the plurality of cells.

9. The system according to claim 7, wherein the tightness probability, the mean value, and the second moment value are calculated analytically.

10. The system according to claim 7, wherein said statistical static timing analyzer assigns weights to the tightness probability, the mean value, and the second moment value for each of the plurality of cells based on at least respective cell volumes.

11. The system according to claim 7, wherein said statistical static timing analyzer combines the tightness probability, the mean value, and the second moment value of all of the plurality of cells based on respective cell volumes, an average value of a probability density function of the at least one of the parameters, and at least one of the tightness probability, the mean value, and the second moment value, wherein the at least one of the tightness probability, the mean value, and the second moment value are calculated for a fixed value of the at least one of the parameters.

12. The system according to claim 11, wherein, for each of the plurality of cells, the at least one of the parameters is fixed to be equal to an average value of the at least one of the parameters in a respective one of the plurality of cells.

13. The system according to claim 6, wherein the integration grid has a plurality of cells, and said statistical static timing analyzer calculates a tightness probability, a mean value, a variance value, and a second moment value for each of the plurality of cells, and calculates one of an approximate maximum and an approximate minimum of two signal arrival times in a same first-order form based on the tightness probability, the mean value, the variance value, and the second moment value.

14. The system according to claim 13, wherein the one of the approximate maximum and the approximate minimum of the two signal arrival times is calculated such that the mean value and the variance value thereof are respectively identical to that of one of an exact maximum and an exact minimum of the two signal arrival times.

15. A method for statistical timing analysis and optimization of an electrical circuit having two or more digital elements, comprising the steps of:
receiving parameters of the electrical circuit, at least one of the parameters having a non-Gaussian probability distribution;
storing at least the at least one of the parameters in a memory:
performing a statistical static timing analysis using a processor to calculate at least one of a signal arrival time and a signal required time for the electrical circuit using the at least one of the parameters having the non-Gaussian probability distribution; and
modifying a component size of the electrical circuit to alter gate timing characteristics of the electrical circuit based upon the at least one of the signal arrival time and the signal required time.

16. The method according to claim 15, wherein the signal arrival time is one of a minimum signal arrival time and a maximum signal arrival time and the signal required time is one of a minimum signal required arrival time and a maximum signal required arrival time.

17. The method according to claim 15, wherein said step of performing the statistical static timing analysis comprises the step of separately integrating over subspaces of parameters with Gaussian probability distributions and subspaces of parameters with non-Gaussian probability distributions.

18. The method according to claim 17, wherein said integrating step integrates over the subspaces of parameters with Gaussian probability distributions analytically and over the subspaces of parameters with non-Gaussian probability distributions numerically.

19. The method according to claim 15, wherein said step of performing the statistical static timing analysis comprises the step of calculating a probability that a signal arrival time A in the electrical circuit is one of greater than and less than a signal arrival time B in the electrical circuit, using the at least one of the parameters having the non-Gaussian probability distribution.

20. The method according to claim 15, wherein said step of performing the statistical static timing analysis comprises the step of defining a finite region of non-Gaussian parameter variations and builds an integration grid in the finite region.

21. The method according to claim 20, wherein the integration grid has a plurality of cells, and said step of performing the statistical static timing analysis comprises the step of calculating a tightness probability, a mean value, and a second moment value for each of the plurality of cells.

22. The method according to claim 21, wherein the tightness probability, the mean value, and the second moment value are calculated for each of the plurality of cells at a condition wherein the at least one of the parameters having the non-Gaussian probability distribution is fixed to be equal to an average value of the at least one of the parameters in a corresponding one of the plurality of cells.

23. The method according to claim 21, wherein the tightness probability, the mean value, and the second moment value are calculated analytically.

24. The method according to claim 21, wherein said step of performing the statistical static timing analysis further comprises the step of assigning weights to the tightness probability, the mean value, and the second moment value for each of the plurality of cells, based on at least respective cell volumes.

25. The method according to claim 21, wherein said step of performing the statistical static timing analysis further comprises the step of combining the tightness probability, the mean value, and the second moment value of all of the plurality of cells based on respective cell volumes, an average value of a probability density function of the at least one of the parameters, and at least one of the tightness probability, the mean value, and the second moment value, wherein the at least one of the tightness probability, the mean value, and the second moment value are calculated for a fixed value of the at least one of the parameters.

26. The method according to claim 25, wherein, for each of the plurality of cells, the at least one of the parameters is fixed to be equal to an average value of the at least one of the parameters in a respective one of the plurality of cells.

27. The method according to claim 20, wherein the integration grid has a plurality of cells, and said step of performing the statistical static timing analysis further comprises the steps of:
calculating a tightness probability, a mean value, a variance value, and a second moment value for each of the plurality of cells; and
calculating one of an approximate maximum and an approximate minimum of two signal arrival times in a same first-order form based on the tightness probability, the mean value, the variance value, and the second moment value.

28. The method according to claim 27, wherein the one of the approximate maximum and the approximate minimum of the two signal arrival times is calculated such that the mean value and the variance value thereof are respectively identical to that of one of an exact maximum and an exact minimum of the two signal arrival times.

29. The method according to claim 15, wherein the statistical static timing analysis is one of an early mode analysis and a late mode timing analysis.

30. The method according to claim 15, wherein the at least one of the signal arrival time and the signal required time is one of a rising signal and a falling signal.

31. The method according to claim 15, wherein the electrical circuit is one of a combinational circuit and a sequential circuit.

32. The method according to claim 15, wherein the statistical static timing analysis is used to calculate timing slack.

33. The method according to claim 15, wherein the electrical circuit is one of static and dynamic logic.

34. The method according to claim 15, wherein the electrical circuit has multiple clock phases.

35. The method according to claim 15, wherein the parameters of the electrical circuit are one of independent and correlated.

36. The method according to claim 15, wherein delays in the electrical circuit are one of stored and calculated on the fly.

37. The method according to claim 17, wherein the integration is one of numerical, analytical and Monte-Carlo.

* * * * *